(12) United States Patent
Duan et al.

(10) Patent No.: US 10,749,128 B2
(45) Date of Patent: Aug. 18, 2020

(54) DEPOSITABLE ION ORGANIC FUNCTION MATERIAL AND USE THEREOF IN ORGANIC ELECTROLUMINESCENT DEVICE

(71) Applicants: KUNSHAN GO-VISIONOX OPTO-ELECTRONICS CO., LTD., KunShan, Jiangsu (CN); Tsinghua University, Beijing (CN)

(72) Inventors: Lian Duan, Beijing (CN); Dongxin Ma, Beijing (CN); Song Liu, Beijing (CN); Jing Xie, Hebei (CN); Fei Zhao, Beijing (CN)

(73) Assignees: KUNSHAN GO-VISIONOX OPTO-ELECTRONICS CO., LTD., Kunshan, Jiangsu (CN); TSINGHUA UNIVERSITY, Beijing (CN)

( * ) Notice: Subject to any disclaimer, the term of this patent is extended or adjusted under 35 U.S.C. 154(b) by 150 days.

(21) Appl. No.: 15/745,060

(22) PCT Filed: Jun. 15, 2016

(86) PCT No.: PCT/CN2016/085803
§ 371 (c)(1),
(2) Date: Jan. 15, 2018

(87) PCT Pub. No.: WO2017/000778
PCT Pub. Date: Jan. 5, 2017

(65) Prior Publication Data
US 2018/0277785 A1  Sep. 27, 2018

(30) Foreign Application Priority Data
Jul. 2, 2015  (CN) .......................... 2015 1 0382459

(51) Int. Cl.
*H01L 51/50* (2006.01)
*H01L 51/00* (2006.01)
(Continued)

(52) U.S. Cl.
CPC .......... *H01L 51/5036* (2013.01); *C07F 15/00* (2013.01); *C07F 15/0033* (2013.01);
(Continued)

(58) Field of Classification Search
None
See application file for complete search history.

(56) References Cited

U.S. PATENT DOCUMENTS

2006/0177695 A1  8/2006  Ragini et al.
2010/0181900 A1*  7/2010  Lyu et al. .................... 313/504
(Continued)

FOREIGN PATENT DOCUMENTS

CN  101186624 A  5/2008
CN  101540375 A1  9/2009
(Continued)

OTHER PUBLICATIONS

He et al. (Adv. Funct. Mater. 2009, 19, p. 2950).*
(Continued)

*Primary Examiner* — Jay Yang
(74) *Attorney, Agent, or Firm* — Liang Legal Group, PLLC

(57) ABSTRACT

The present invention relates to a depositable ionic organic functional material having a structure selected from the formulas (21) to (26). The depositable ionic organic functional material can be used in high-efficiency blue to red OLEDs. The present invention also relates to an organic
(Continued)

electroluminescent device using the depositable ionic organic functional material as a dopant in the organic light-emitting layer thereof.

7 Claims, 5 Drawing Sheets

(51) Int. Cl.
*C07F 15/00* (2006.01)
*C09K 11/06* (2006.01)
*H01L 51/52* (2006.01)

(52) U.S. Cl.
CPC .......... *C09K 11/06* (2013.01); *H01L 51/0085* (2013.01); *H01L 51/5024* (2013.01); *H01L 51/5056* (2013.01); *H01L 51/5072* (2013.01); *H01L 51/5088* (2013.01); *H01L 51/5206* (2013.01); *H01L 51/5221* (2013.01)

(56) References Cited

U.S. PATENT DOCUMENTS

2013/0203997 A1 8/2013 Konno et al.
2015/0318498 A1 11/2015 Stoessel et al.

FOREIGN PATENT DOCUMENTS

| WO | 2012057138 A1 | 5/2012 |
| WO | 2014094960 A1 | 6/2014 |
| WO | 2014094962 A2 | 6/2014 |

OTHER PUBLICATIONS

Korean IP Office, Second Office Action of Korea Application No. 10-2018-7003312.
Dongxin Ma et al., "Increased phosphorescent quantum yields of cationic iridium(III) complexes by wisely controlling the counter anions," Chem. Comm., vol. 50, pp. 530-532 (2014), Royal Society of Chemistry, London, England.
Dongxin Ma et al., "Trifluoromethylation of Tetraphenylborate Counterions in Cationic Iridium(III) Complexes: Enhanced Electrochemical Stabilities, Charge-Transport Abilities, and Device Performance," Chem. Eur. J., vol. 20, pp. 15903-15912 (2014), Wiley-VCH Verlag GmbH & Co., Germany.
Dongxin Ma et al., "Tetraphenylborate versus tetraimidazolylborate as counterions for cationic iridium(III) complexes: enhanced electrochemical stabilities and electroluminescence," Dalton Trans., vol. 44, pp. 8521-8528 (2015), Royal Society of Chemistry, London, England.
EPO, European Extended Search report, dated Mar. 2, 2018.
Dongxin Ma et al., Trfluoromethylation of Tetraphenylborate Counterions in Cationic Iridium (III) Complexes: Enhanced Electrochemical Stabilities, Charge-transport Abilities, and Device Performance, Chem. Eur. J. 2014, 20, 15903-15912, Wiley-VCH Verlag GmbH & Co., KGa, Weinheim, Germany.
Wai-Yeung Wong et al., Efficient Organic Light-Emitting Diodes based on Sublimable Charge Iridium Phosphorescent Emitters, Adv. Funct. Mater., 2007, 17, 315-323, Wiley-VCH Verlag GmbH & Co., KGa, Weinheim, Germany.
Lei He et al., Blue-Emitting Cationic Iridium Complexes with 2-(1H-Pyrazol-1-yl)pyridine as the Ancillary Ligand for Efficient Light-Emitting Electrochemical Cells, Adv. Funct. Mater., 2008, 18, 2123-2131, Wiley-VCH Verlag GmbH & Co., KGa, Weinheim, Germany.
Lei He et al., Toward Highly Efficient Solid-State White Light-Emitting Electrochemical Cells: Blue-Green to Red Emitting Cationic Iridium Comlexes with Imidazole-Type Ancillary Ligands, Adv. Funct. Mater., 2009, 19, 2950-2960, Wiley-VCH Verlag GmbH & Co., KGa, Weinheim, Germany.
Jing Zhang et al., Efficient Light-Emmitting Electrochemical Cells (LECs) Based on Ionic Iridium (III) Complexes 1,3,4-Oxadiazole Ligands, Adv. Funct. Mater., 2013, 23, 4667-4677, Wiley-VCH Verlag GmbH & Co., KGa, Weinheim, Germany.
SIPO, First Office Action, dated Jan. 22, 2018.
TW IPO, First Office Action, dated Sep. 4, 2017.
WO, PCT/CN2016/085803—Written Opinion—English translation, dated Sep. 20, 2016.
Refusal Decision of Chinese Application No. 2015103824597.
"Trifluoromethylation of Tetraphenylborate Counterions in Cationic Iridium(III) Complexes: Enhanced Electrochemical Stabilities, Charge-Transport Abilities, and Device Performance", D. Ma et al., Chem. Eur. J.
Second Office Action of Chinese Application No. 2015103824597.
Communication pursuant to Rule 71(3) EPC of European Application No. 16817142.9.

* cited by examiner

| 03 |
|----|
| 07 |
| 06 |
| 05 |
| 04 |
| 02 |
| 01 |

Figure 9

DEPOSITABLE ION ORGANIC FUNCTION MATERIAL AND USE THEREOF IN ORGANIC ELECTROLUMINESCENT DEVICE

TECHNICAL FIELD

The present invention relates to the field of organic electroluminescent materials, and in particular relates to a depositable ionic organic functional material which can be used in an organic electroluminescent device, a preparation method thereof and use thereof in the field of organic electroluminescent materials.

BACKGROUND

The organic light-emitting layer of an organic electroluminescent device OLED is prepared mainly by using a fully fluorescent material, a fully phosphorescent material, or a mixture of fluorescent material and phosphorescent material. The fluorescent light-emitting material in the prior art is prone to fluorescent quenching, and the device prepared by doping the light-emitting layer with the fluorescent light-emitting material in the prior art is prone to crystallization phenomenon, which leads to reduced service life. And it is difficult to use a phosphorescent light-emitting material to synthesize a stable dark-blue light material.

In order to solve the above-mentioned problem, cationic complex is developed to be used as light-emitting material. The synthesis conditions of this type of material are mild and easy to carry out, with high yield, and the product is simple to purify; secondly, this type of complex has good redox properties and can increase the stability of the device. However, because ionic material has poor volatilization properties and is not suitable for preparing a device by means of evaporation-deposition, which severely limits the use of this type of material in electronic devices.

*Advanced Functional Materials,* 2007, 17, 315 discloses an Iridium complex having a structure shown in the following formula (41), wherein the reported two kinds of depositable ionic complexes adopt an Iridium complex as the cation, and adopts a hexafluorophosphate anion as the counterion. This method has a deficiency of not having universality, i.e. more kinds of depositable ionic complexes cannot be developed according to this route.

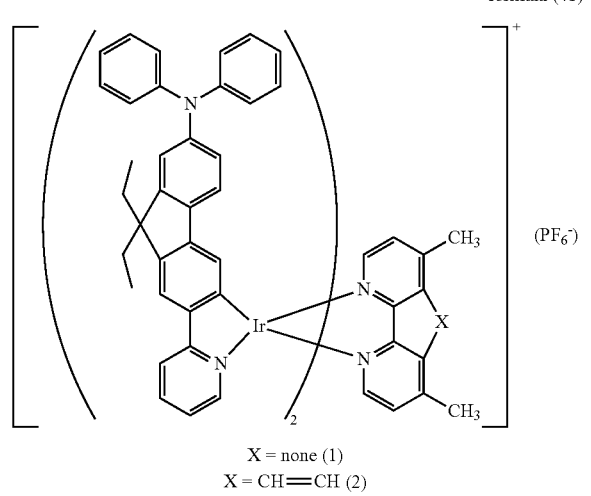

formula (41)

X = none (1)
X = CH=CH (2)

SUMMARY OF THE INVENTION

An objective of the present invention is to provide a depositable ionic organic functional material wherein, when the functional material is used as a luminescent dye, the synthesis conditions are mild and easy to carry out, the yield is high, the product is simple to purify, and the functional material can be used in high-efficiency OLEDs emitting blue to red light.

In order to achieve the above-mentioned objective, the present invention adopts the following technical scheme:

A depositable ionic organic functional material is provided, which has a structure shown in the following formula (1):

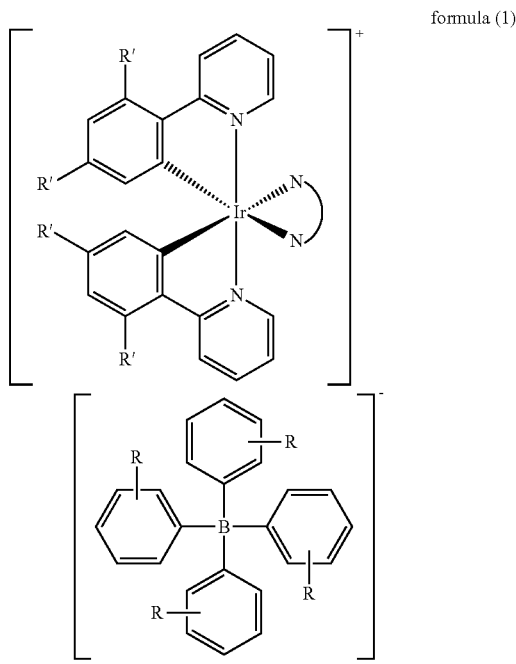

formula (1)

wherein, R is a hydrogen atom, a halogen atom or —$CF_3$;
R' is a hydrogen atom or a halogen atom;
the N^N ligand is selected from Pzpy shown in the following formula (31) and its derivatives, Pyim shown in the following formula (32), Ptop shown in the following formula (33), Pop shown in the following formula (34), Bpy shown in the following formula (35), and Dfppy shown in the following formula (36):

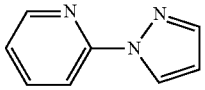

formula (31)

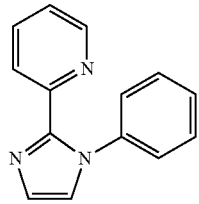

formula (32)

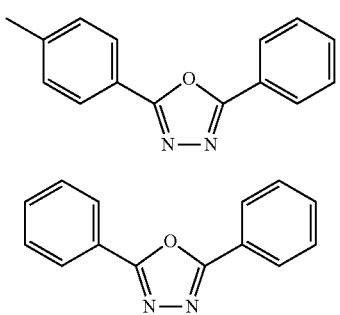
formula (33)
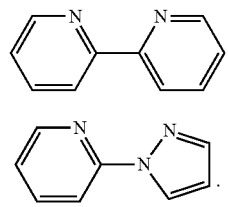
formula (35)
formula (34)
formula (36)
Preferable, the depositable ionic complex has a structure shown in the following formulas (11) to (16) and formulas (21) to (26):
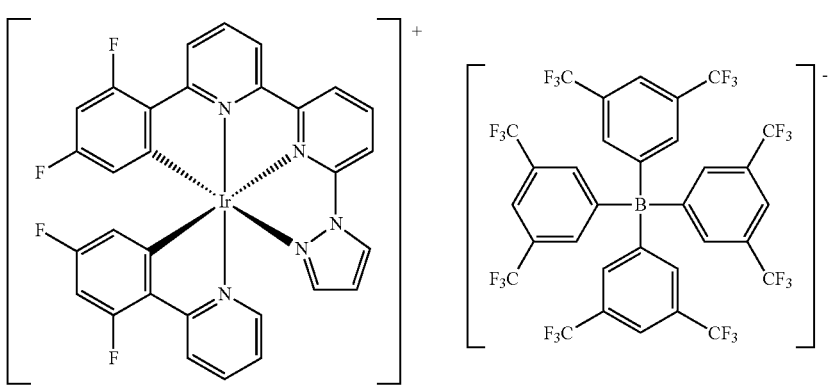
formula (11)
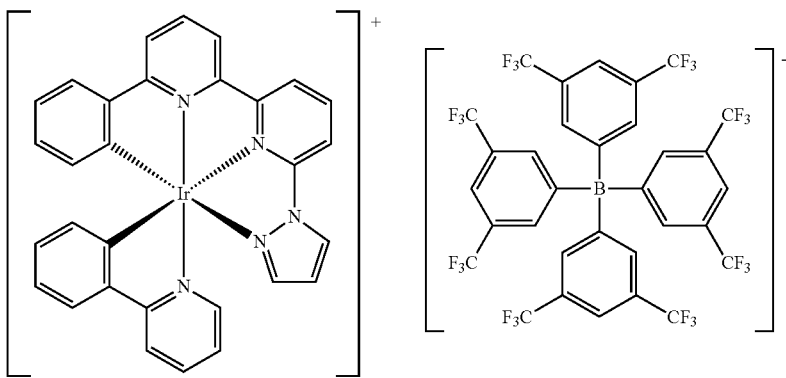
formula (12)
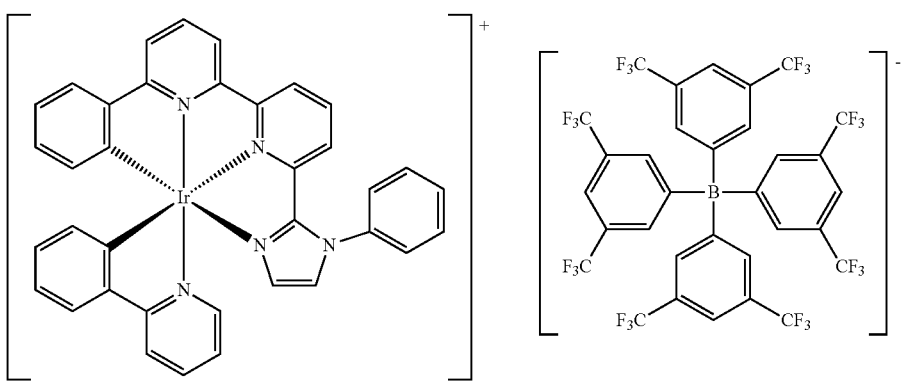
formula (13)

-continued
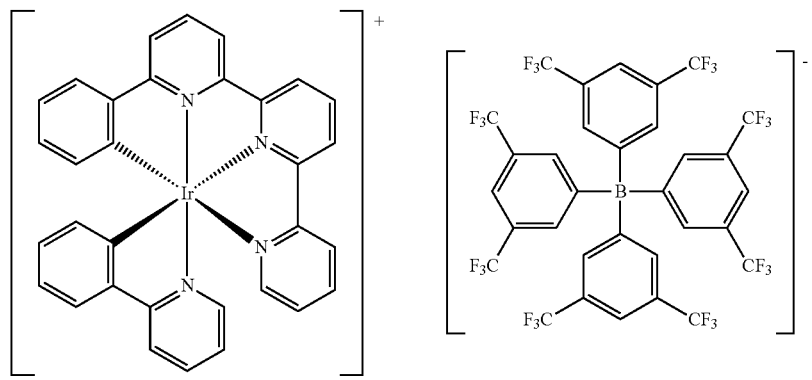
formula (14)
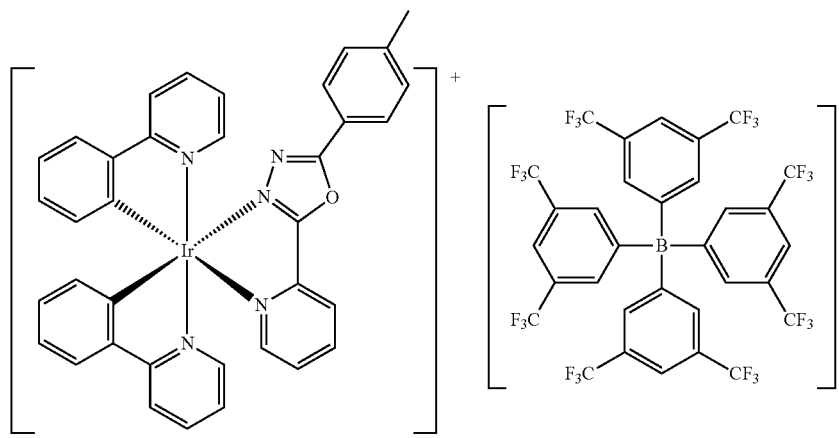
formula (15)
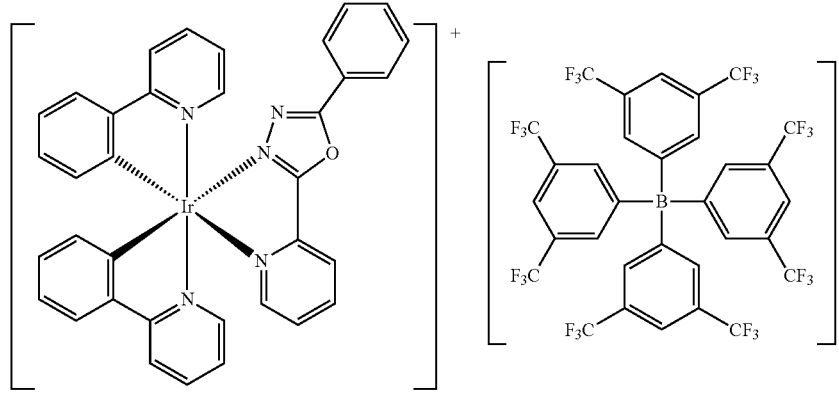
formula (16)
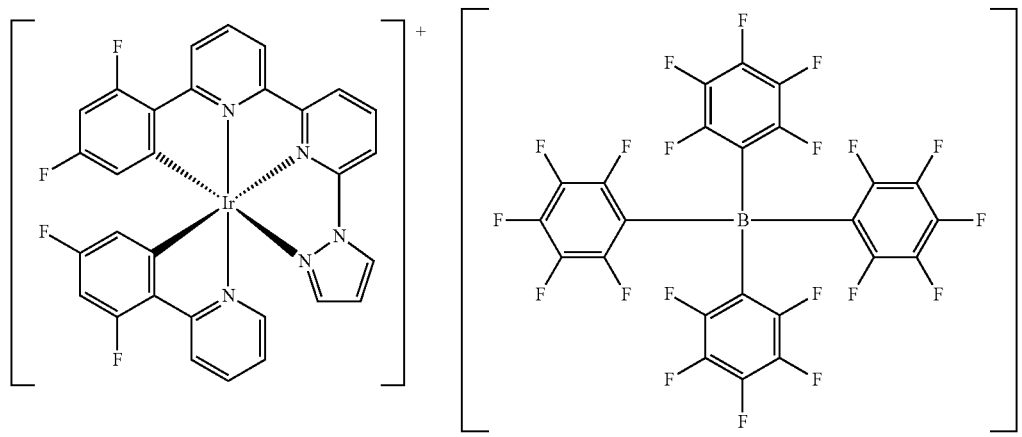
formula (21)

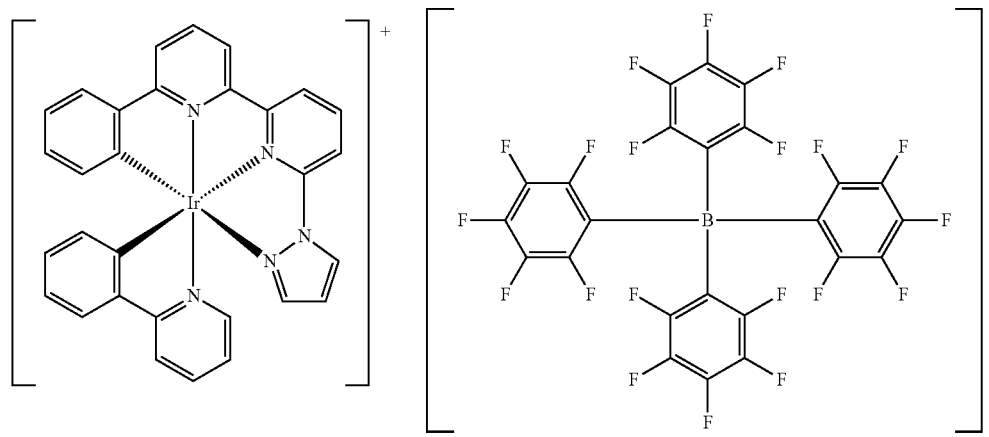
formula (22)
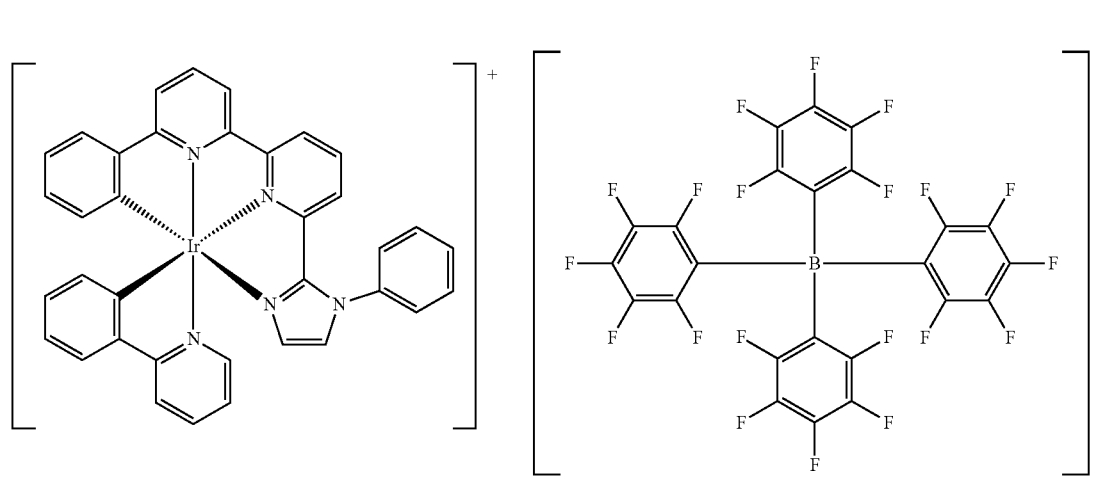
formula (23)
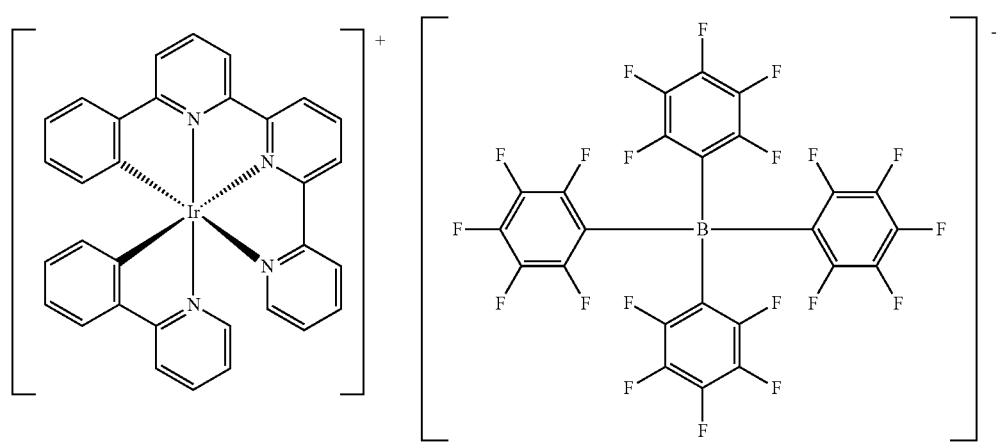
formula (24)

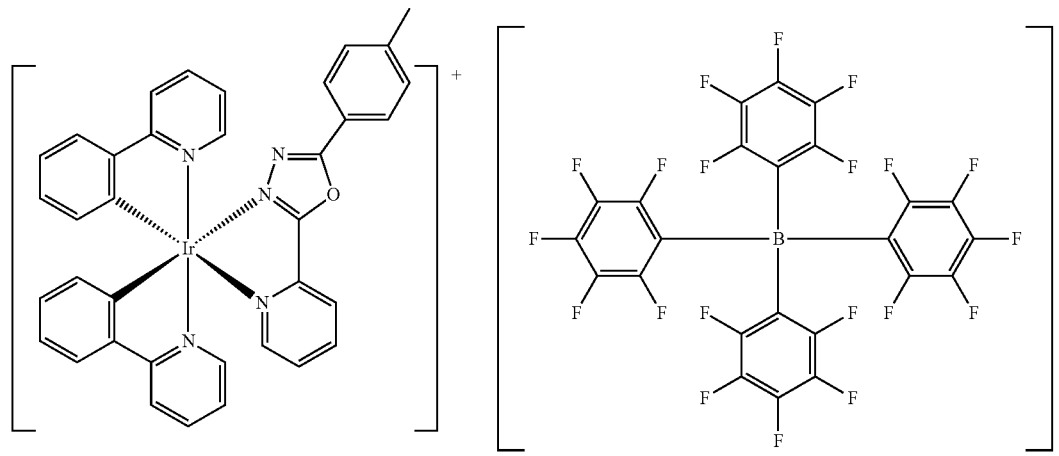

formula (25)

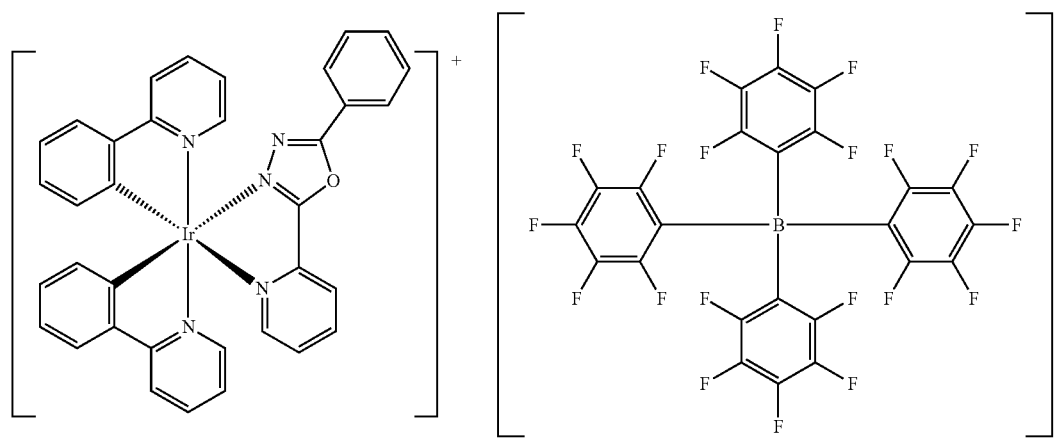

formula (26)

A use of the aforementioned depositable ionic organic functional material in an organic electroluminescent device is provided, wherein the depositable ionic organic functional material is used as a dye in an organic light-emitting layer of the organic electroluminescent device.

An organic electroluminescent device is provided, which comprises a substrate, and an anode layer, an organic light-emitting functional layer, a cathode layer formed in sequence upon the substrate, wherein the organic light-emitting functional layer comprises a hole transport layer, an organic light-emitting layer and an electron transport layer, and wherein a host material of the organic light-emitting layer is doped with the aforementioned depositable ionic organic functional material.

Doping concentration of the depositable ionic organic functional material is 2 wt %-10 wt %.

The depositable ionic organic functional material is red, yellow, green or blue light emitting material.

The organic light-emitting layer has a thickness of 10 mm-50 mm, preferably 10 mm-30 mm.

As compared to the prior art, the depositable ionic organic functional material of the present invention has the following advantages:

A molecular design strategy for obtaining a depositable ionic organic functional material is provided for the first time by the present invention, wherein a series of depositable ionic Iridium complexes are designed and developed. In this type of depositable ionic Iridium complexes, a tetraphenylborate derivative anion, which is a counterion with large steric hindrance and good electrical charge dispersion, is introduced into a cationic Iridium complex to replace the hexafluorophosphate anion as mentioned in the background technology, thereby reducing the interactivity between anions and cations. Furthermore, the tetraphenylborate derivative anion can increase the electrical charge transport capability, reduce the drive voltage of the device, reduce the energy consumption, and thus effectively reduce the production cost. The present invention is simple and easy to carry out and has universality, depositable ionic Iridium complexes as dyes of various colors can be developed accordingly, so as to produce high-efficiency OLEDs emitting blue to red light.

BRIEF DESCRIPTION OF THE DRAWINGS

FIG. 9 is a structural schematic diagram of an organic electroluminescent device, wherein 01 is substrate, 02 is anode layer, 03 is cathode layer, 04 is hole-injection layer, 05 is hole-transport layer, 06 is organic light-emitting layer, and 07 is electron-transport layer.

DETAILED DESCRIPTION OF EMBODIMENTS

Figure 1:
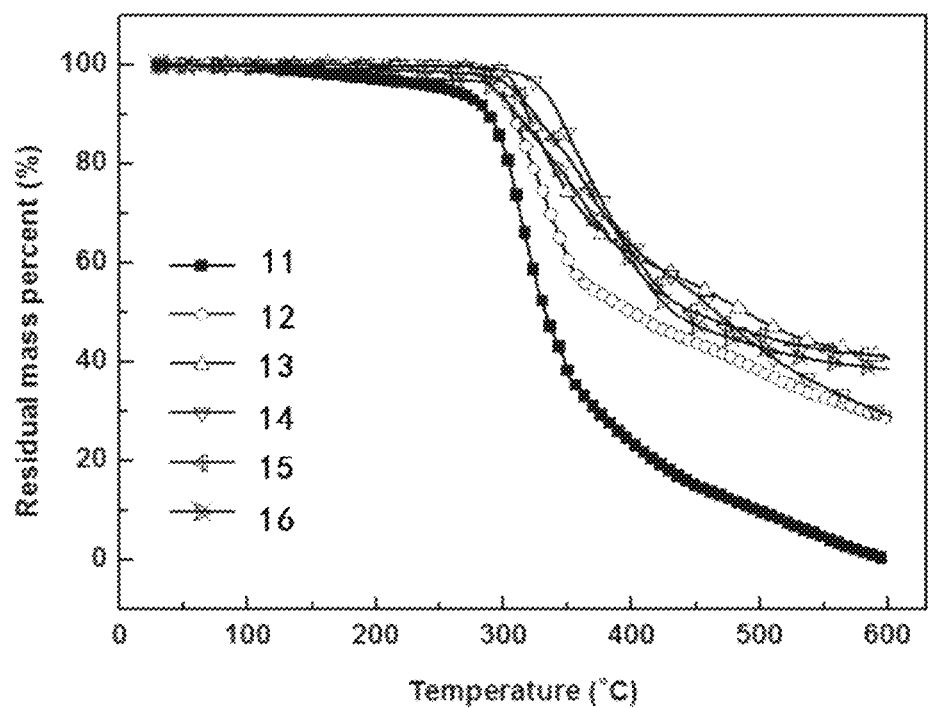
FIG. 1 is a thermogravimetric analysis diagram of the complexes shown by the formulas (11) to (16) in a N2 atmosphere.

The present invention is further described hereinafter by illustrating specific embodiments.

The present invention can be implemented in many different forms, and should not be interpreted to be limited to the embodiments described herein. On the contrary, by providing these embodiments, the present disclosure is made complete and thorough, and the inventive concept of the present invention is sufficiently conveyed to those skilled in the art, wherein the present invention is defined by the Claims. In the accompanying drawings, for the sake of clarity, dimensions and relative sizes of layers and areas might be exaggerated. It should be understood that, when one element such as a layer, an area or a substrate is described as "formed on" or "configured on" another element, this one element may be configured directly upon that another element, or there may exists intermediate element(s). On the contrary, when one element is described as "directly formed upon" or "directly configured upon" another element, there exists no intermediate element.

The present invention provides a depositable ionic organic functional material, wherein the depositable ionic organic functional material has a structure shown in the following formula (1):

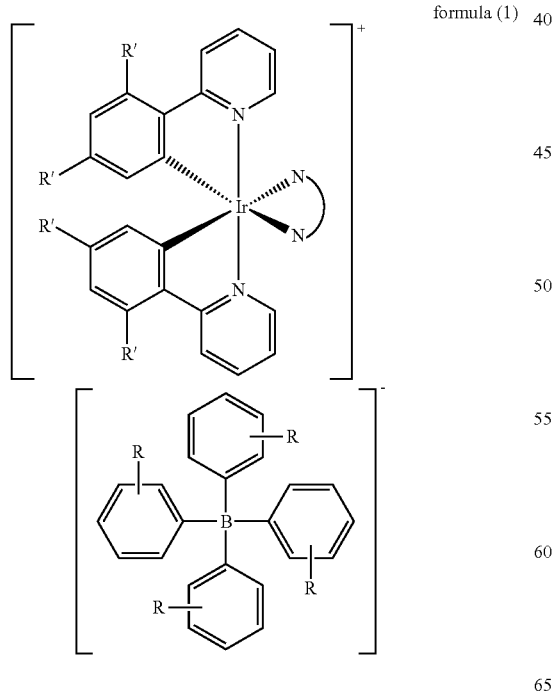

formula (1)

wherein, R is a hydrogen atom, a halogen atom or —CF$_3$;
R' is a hydrogen atom or a halogen atom;

N^N ligand is selected from Pzpy shown in the following formula (31) and its derivatives, Pyim shown in the following formula (32), Ptop shown in the following formula (33), Pop shown in the following formula (34), Bpy shown in the following formula (35), and Dfppy shown in the following formula (36):

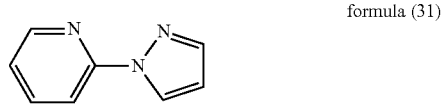

formula (31)

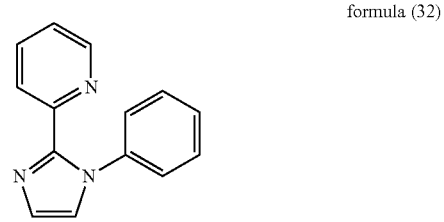

formula (32)

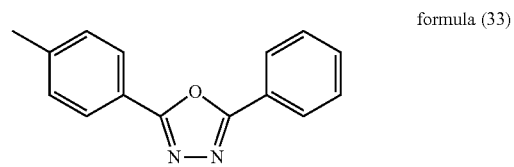

formula (33)

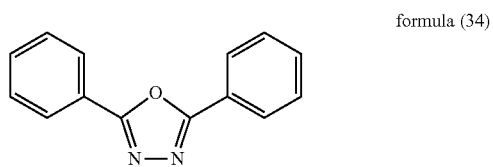

formula (34)

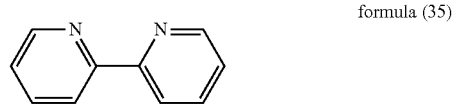

formula (35)

formula (36)

The depositable ionic organic functional material is preferably:
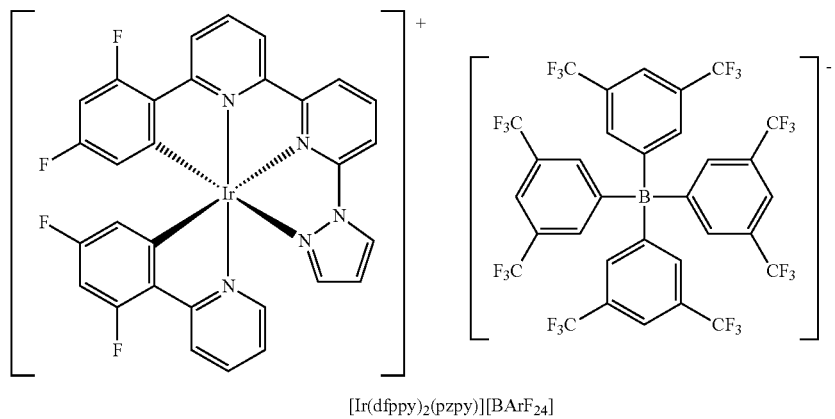
[Ir(dfppy)$_2$(pzpy)][BArF$_{24}$]
formula (11)
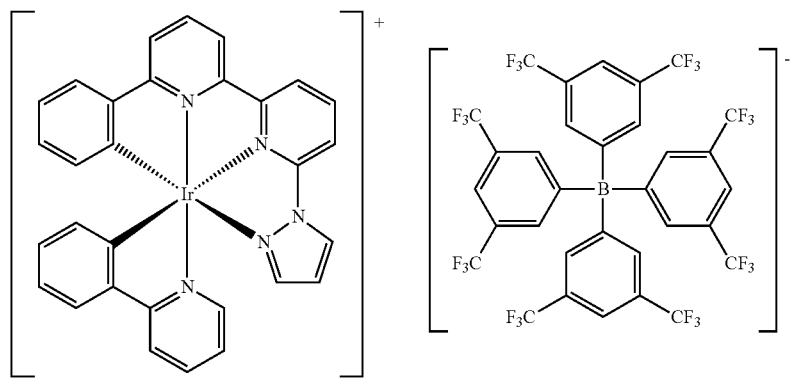
[Ir(ppy)$_2$(pzpy)][BArF$_{24}$]
formula (12)
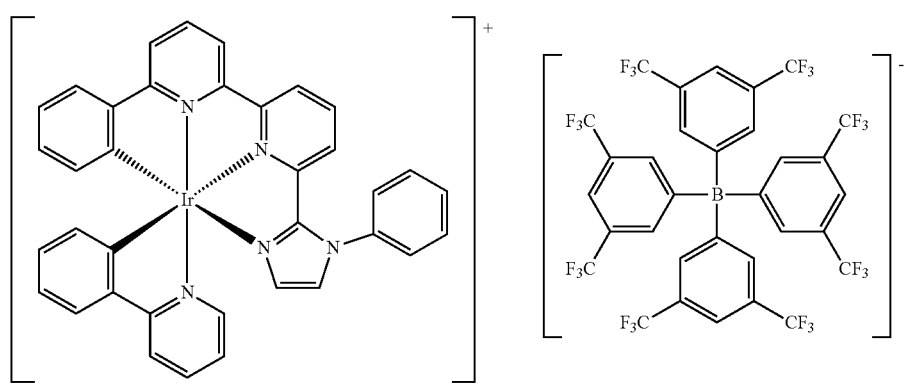
[Ir(ppy)$_2$(pyim)][BArF$_{24}$]
formula (13)

formula (14)
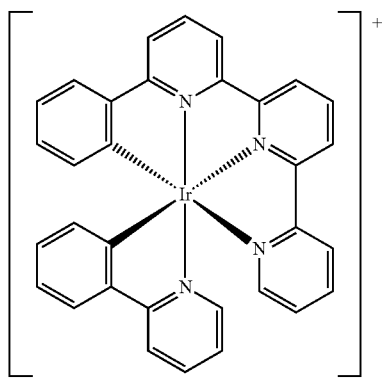
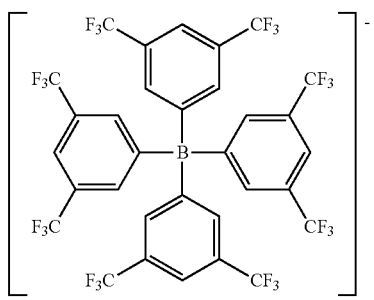
[Ir(ppy)₂(bpy)][BArF₂₄]
formula (15)
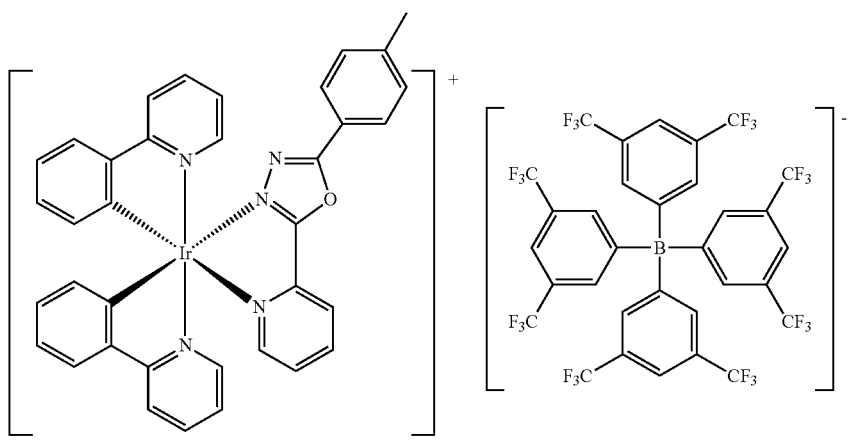
[Ir(ppy)₂(ptop)][BArF₂₄]
formula (16)
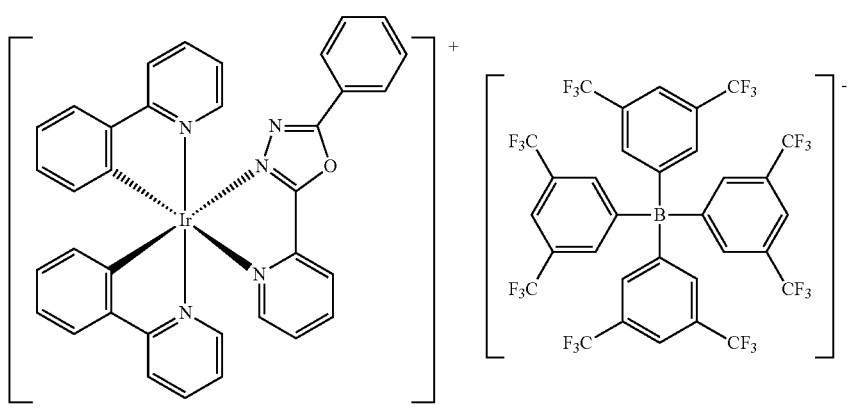
[Ir(ppy)₂(pop)][BArF₂₄]

-continued
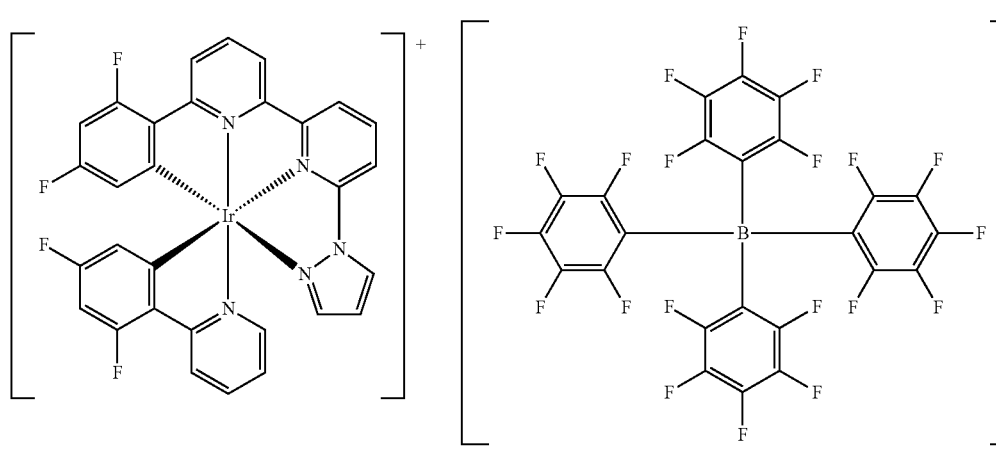
[Ir(dfppy)₂(pzpy)][B(5fph)₄]
formula (21)
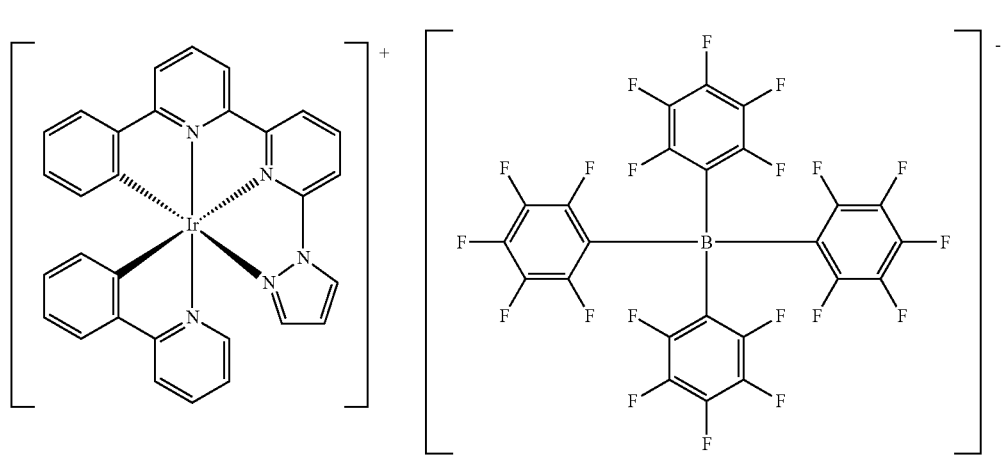
[Ir(ppy)₂(pzpy)][B(5fph)₄]
formula (22)
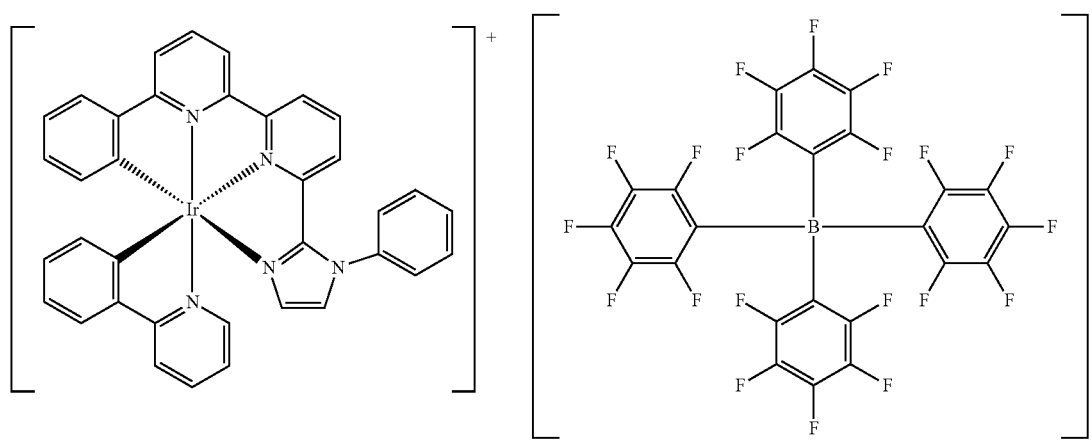
[Ir(ppy)₂(pyim)][B(5fph)₄]
formula (23)

-continued
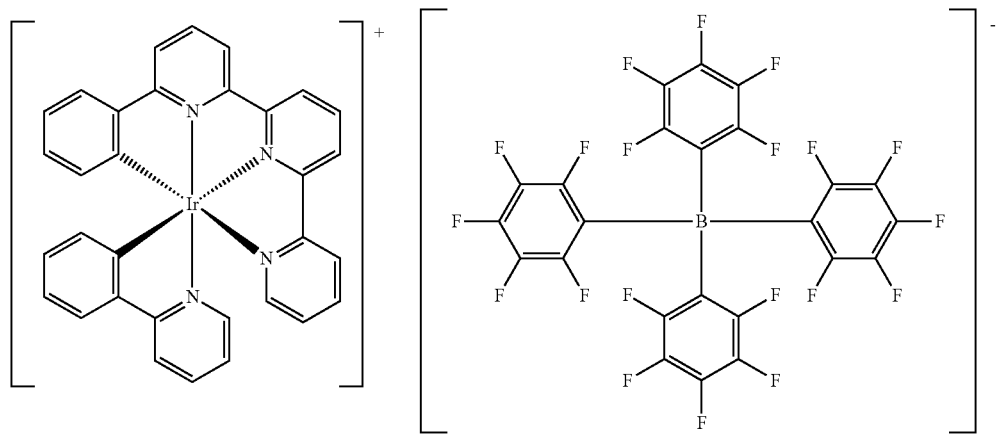
[Ir(ppy)$_2$(bpy)][B(5fph)$_4$]
formula (24)
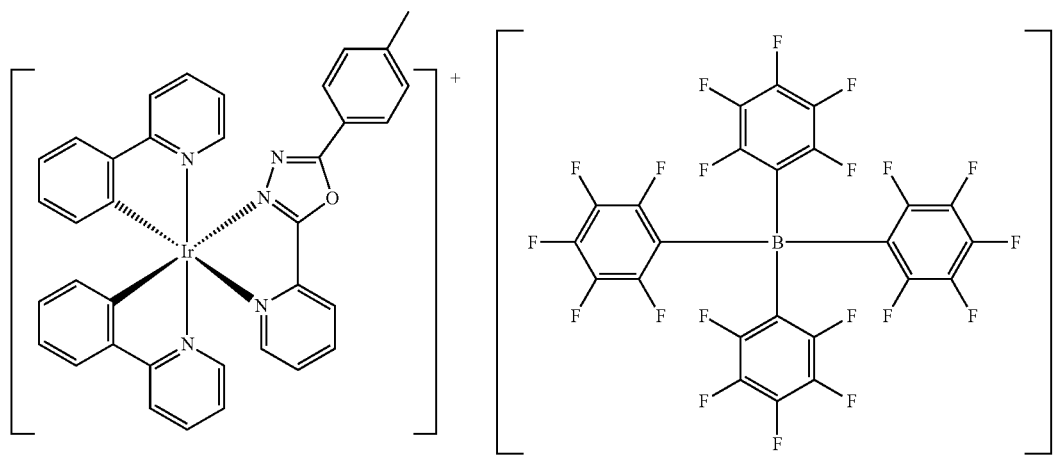
[Ir(ppy)$_2$(ptop)][B(5fph)$_4$]
formula (25)
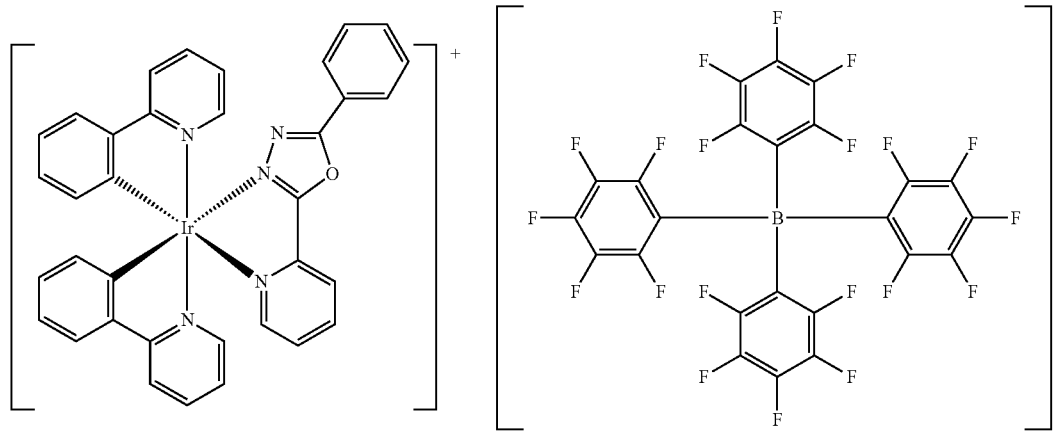
[Ir(ppy)$_2$(pop)][B(5fph)$_4$]
formula (26)

A use of the aforementioned depositable ionic organic functional material in an organic electroluminescent device is provided.

In the above-mentioned use, the depositable ionic organic functional material is used as a dye in an organic light-emitting layer of the organic electroluminescent device.

Figure 9:
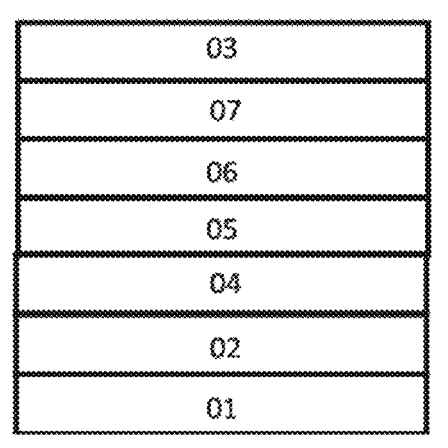

As shown in FIG. 9, the organic electroluminescent device comprises a substrate 01, and an anode layer 02, an organic light-emitting functional layer, a cathode layer 03 formed in sequence upon the substrate, wherein the organic light-emitting functional layer comprises a hole injection layer 04, a hole transport layer 05, an organic light-emitting layer 06 and an electron transport layer 07, and wherein a host material of the organic light-emitting layer 06 is doped with the aforementioned depositable ionic organic functional material.

Doping concentration of the depositable ionic organic functional material is 2 wt %-10 wt %.

The depositable ionic organic functional material is red, yellow, green or blue light emitting material.

The organic light-emitting layer has a thickness of 10 mm-50 mm, preferably 10 mm-30 mm.

If not particularly described otherwise, the respective layers of the device in the present invention are made of the following materials:

The anode layer may adopt inorganic material or organic conducting polymer. The inorganic material is usually selected from metal oxides such as indium tin oxide (ITO), zinc oxide (ZnO), indium zinc oxide (IZO), and metals having relatively high work function such as gold, copper, silver, and it is preferably ITO. The organic conducting polymer is preferably selected from Polythiophene/Polyvinylbenzenesulfonate sodium (hereinafter abbreviated as PEDOT:PSS), and polyaniline (hereinafter abbreviated as PANI).

The cathode layer usually adopts metals having relatively low work function such as lithium, magnesium, calcium, strontium, aluminum, indium, or their alloys with copper, gold, silver, or the cathode layer is an electrode layer formed by alternately arranged metal and metal fluoride. In the present invention, the cathode layer is preferably a mixed electrode of Mg:Ag/Ag.

The material of the hole transport layer may be selected from aromatic amine type, carbazole type and branched polymer type low molecular material, and is preferably selected from NPB and TCTA.

In the organic electroluminescent device of the present invention, there may also be a hole injection layer between the anode layer and the hole transport layer. The material of the hole injection layer may adopt, for example, 2,3,6,7,10,11-hexacyanyl-1,4,5,8,9,12-hexaazatriphenylene (HAT-CN), 4,4',4"-tri-(3-methyl-phenyl-aniline)-tri-aniline doped with F4TCNQ, or may adopt copper phthalocyanine (CuPc), or may be a metal oxide such as molybdenum oxide, rhenium oxide.

The light-emitting material of the organic light-emitting layer 06 may be a fluorescent dye selected from coumarins such as DMQA or C545T, bis-pyrans such as DCJTB or DCM, or may be a metal complex containing lanthanide series or actinide series metal such as Ir, Pt, Os, Ru, Rh, and Pd.

The fluorescent dye has a doping concentration no higher than 5 wt % in the organic light-emitting layer 06, and the phosphorescent dye has a doping concentration no higher than 30 wt % in the organic light-emitting layer 06. Said doping concentration=dye mass/(dye mass+host material mass)×100%.

The host material of the organic light-emitting layer 06 may be selected from materials which are commonly used as a substrate material, such as 4,4'-di-(carbazole-9-yl)-biphenyl (CBP).

The material of the electron transport layer may adopt a material which is commonly used for an electron transport layer, such as aromatic fused ring compound (e.g. pentacene, perylene) or o-phenanthroline compound (e.g. Bphen, BCP).

The organic electroluminescent device of the present invention comprises an anode layer 02, a hole transport layer 05, an organic light-emitting layer 06, an electron transport layer 07 and a cathode layer 03 sequentially deposited in a stacked manner upon a substrate 01, which are then encapsulated.

The substrate may be a glass substrate or a flexible substrate, wherein the flexible substrate may adopt polyester, polyimide compound material, or a thin metal plate. The layered stacking and encapsulation may be conducted by using any suitable method known to a person skilled in the art.

A specific preparation method of the organic electroluminescent device of the present invention is as follows:

Firstly, washing a glass substrate with detergent or deionized water, placing the glass substrate under an infrared lamp for drying, and spattering a layer of anode material with a film thickness of 150 nm upon the glass substrate.

Then, placing the above-mentioned glass substrate with anode layer into a vacuum chamber, vacuumed to $1\times10^{-4}$ Pa, continuing to evaporation coating NPB as a hole transport layer upon the anode layer, at a film coagulation speed of 0.1 nm/s, to get an evaporation coated film thickness of 40 nm.

Evaporation coating an organic light-emitting layer upon the hole transport layer by using a double source co-evaporation method, wherein the mass percentages of the host material and the dye are controlled by using a film thickness monitor-controller to adjust the film coagulation speed, and the evaporation coated film thickness thereof is 30 nm.

Continuing to evaporation coating a layer of TPBi material as a second electron transport layer upon the organic light-emitting layer, at a deposition rate of 0.1 nm/s, to get an evaporation coated film total thickness of 30 nm.

Finally, evaporation coating a Mg:Ag layer and a Ag layer in sequence as a cathode layer upon the electron transport layer, wherein the Mg:Ag layer is coated by using a double source co-evaporation method, and the mass percentages of Mg and Ag are controlled by using a film thickness monitor-controller to adjust the film coagulation speed, and the evaporation coated film thickness thereof is 150 nm; the Ag layer is evaporation coated at a speed of 1.0 nm/s, to get a thickness of 50 nm.

Embodiment 1

The synthesis routes of the N^N ligand Pzpy, Pyim, Ptop and Pop in the complexes are as follows:
(1) Synthesis Process of Pzpy:
See details in He, L., et al., *Adv Funct. Mater* 18, 2123-2131 (2008).

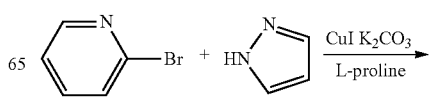

-continued

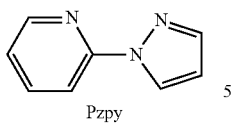
Pzpy (2) Synthesis Process of Pyim:

See details in He, L., et al., *Adv Funct. Mater* 19, 2950-2960 (2009).

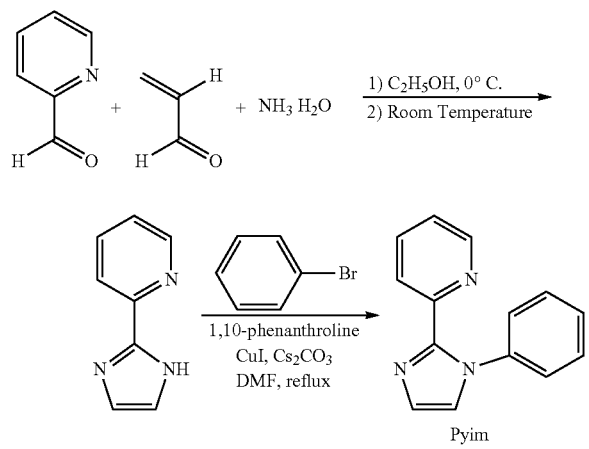

(3) Synthesis Process of Ptop:

See details in Zhang, J., et al. *Adv. Funct. Mater* 23, 4667-4677 (2013).

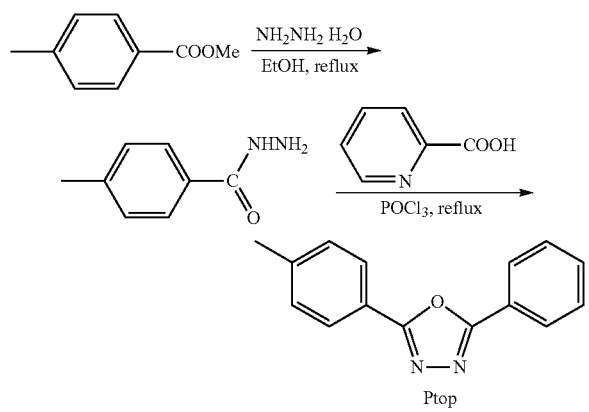

(4) Synthesis Process of Pop:

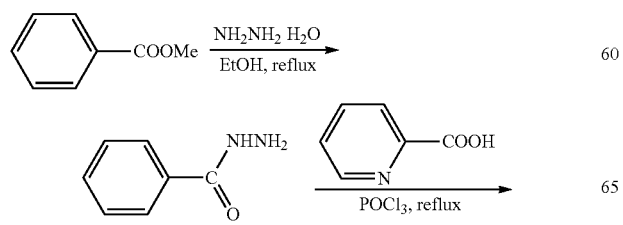

-continued

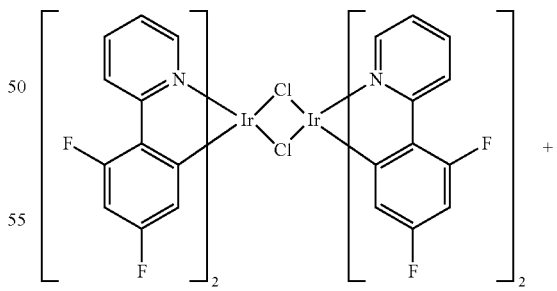
Pop

Embodiment 2

Synthesis Process of [Ir(dfppy)$_2$(pzpy)][BArF$_{24}$] Shown in Formula (11)

Di-chlorine bridged Iridium di-ligand [Ir(dfppy)$_2$Cl]$_2$ (3.100 g, 2.55 mmol) and pzpy ligand (0.743 g, 5.12 mmol) is dissolved in 1,2-glycol (60 mL). In nitrogen atmosphere, the solution system is refluxed for 12 h at 140° C. to get a clear bright yellow solution. After cooling to room temperature, Na[BArF$_{24}$] (4.522 g, 5.10 mmol) is slowly added to the reaction system with stirring. The reaction product is suction filtrated, washed with CH$_2$Cl$_2$, and then dried over a night in a 70° C. vacuum drying oven. The crude product is subsequently passed through silica chromatographic column (200-300 mesh), with CH$_2$Cl$_2$ as the mobile phase, to get the clathrate compound [Ir(dfppy)$_2$(pzpy)][BArF$_{24}$] shown in formula (11) as pale yellow powder (5.283 g, 3.34 mmol) at a yield of 66%.

$^1$H-NMR (600 MHz, DMSO-d$_6$): δ 9.34 (d, J=3.1 Hz, 1H), 8.55 (d, J=8.5 Hz, 1H), 8.40-8.36 (m, 1H), 8.30 (d, J=7.3 Hz, 2H), 8.07 (t, J=6.3 Hz, 2H), 7.84 (d, J=5.1 Hz, 1H), 7.78 (d, J=5.8 Hz, 1H), 7.73 (s, 4H), 7.63 (s, 8H), 7.56 (t, J=5.4 Hz, 2H), 7.32 (t, J=6.7 Hz, 1H), 7.29 (t, J=6.7 Hz, 1H), 7.01-6.91 (m, 2H), 5.65 (d, J=2.3 Hz, 1H), 5.64 (d, J=2.3 Hz, 1H), 5.62 (d, J=2.3 Hz, 1H), 5.60 (d, J=2.3 Hz, 1H); $^{19}$F-NMR (600 MHz, DMSO-d$_6$): δ −61.68 (s, 24F), −106.51 (s, 1F), −107.12 (s, 1F), −108.67 (s, 1F), −109.29 (s, 1F); MS (ESI) [m/z]: [M-BArF$_{24}$]$^+$ calcd for C$_{30}$H$_{19}$F$_4$IrN$_5$, 718.12; found, 718.39; [M-Ir(dfppy)$_2$(pzpy)]$^-$ calcd for C$_{32}$H$_{12}$BF$_{24}$, 863.06; found, 863.35.

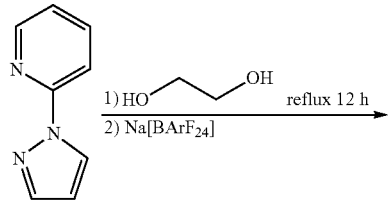

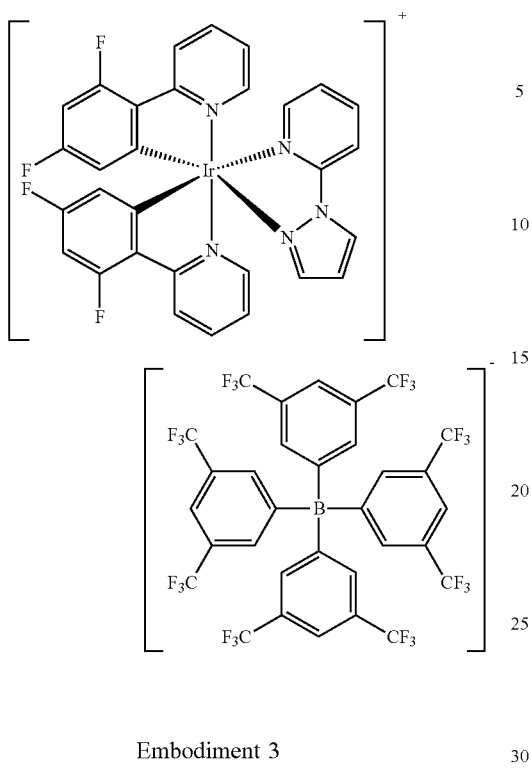

Embodiment 3

Synthesis Process of [Ir(ppy)$_2$(pzpy)][BArF$_{24}$] Shown in Formula (12)

The reactants are [Ir(ppy)$_2$Cl]$_2$ (1.662 g, 1.55 mmol) and pzpy ligand (0.468 g, 3.22 mmol), and by going through the same synthesis method as that of Embodiment 2, the clathrate compound [Ir(ppy)$_2$(pzpy)][BArF$_{24}$] shown in formula (12) is obtained as pale yellow powder (3.790 g, 2.51 mmol) at a yield of 81%.

$^1$H-NMR (600 MHz, DMSO-d$_6$): δ 9.30 (d, J=3.0 Hz, 1H), 8.53 (d, J=8.5 Hz, 1H), 8.35-8.30 (m, 1H), 8.26 (dd, J=8.0 Hz, 3.9 Hz, 2H), 7.95 (ddd, J=7.7 Hz, 3.2 Hz, 1.9 Hz, 2H), 7.89 (dd, J=12.6 Hz, 7.8 Hz, 2H), 7.77 (d, J=5.7 Hz, 1H), 7.71 (d, J=5.3 Hz, 1H), 7.68 (s, 4H), 7.65 (d, J=5.6 Hz, 1H), 7.61 (s, 8H), 7.55-7.51 (m, 1H), 7.28 (d, J=1.9 Hz, 1H), 7.22 (t, J=6.7 Hz, 1H), 7.18 (t, J=6.6 Hz, 1H), 7.01 (t, J=8.0 Hz, 1H), 6.98 (t, J=7.5 Hz, 1H), 6.91-6.87 (m, 2H), 6.84 (t, J=7.4 Hz, 1h), 6.19 (dd, J=9.6 Hz, 7.9 Hz, 2H); $^{19}$F-NMR (600 MHz, DMSO-d$_6$): δ −61.74 (s, 24F); MS (ESI) [m/z]: [M-BArF$_{24}$]$^+$ calcd for C$_{30}$H$_{23}$IrN$_5$, 646.16; found, 646.16; [M-Ir(ppy)$_2$(pzpy)]$^-$ calcd for C$_{32}$H$_{12}$BF$_{24}$, 863.06; found, 863.06.

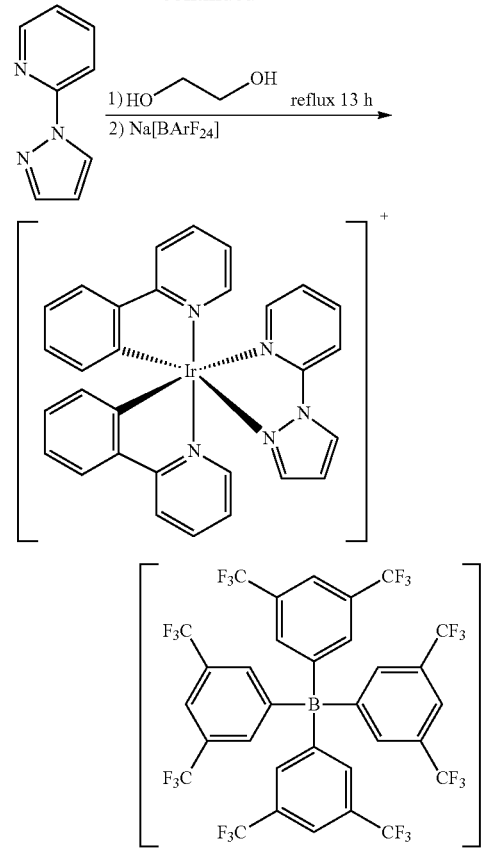

Embodiment 4

Synthesis Process of [Ir(ppy)$_2$(pyim)][BArF$_{24}$] Shown in Formula (13)

The reactants are [Ir(ppy)$_2$Cl]$_2$ (3.064 g, 2.86 mmol) and pyim ligand (1.255 g, 5.67 mmol), and by going through the same synthesis method as that of Embodiment 2, the clathrate compound [Ir(ppy)$_2$(pyim)][BArF$_{24}$] shown in formula (13) is obtained as yellow powder (1.024 g, 0.77 mmol) at a yield of 86%.

$^1$H-NMR (600 MHz, DMSO-d$_6$): δ 8.25 (t, J=8.6 Hz, 2H), 7.98-7.87 (m, 8H), 7.86 (d, J=1.4 Hz, 1H), 7.83 (d, J=5.4 Hz, 1H), 7.73 (d, J=4.9 Hz, 4H), 7.68 (s, 4H), 7.62 (s, 8H), 7.51-7.47 (m, 1H), 7.28-7.25 (m, 1H), 7.25-7.20 (m, 1H), 7.02-6.95 (m, 2H), 6.93 (d, J=8.3 Hz, 1H), 6.91-6.84 (m, 2H), 6.64 (d, J=1.4 Hz, 1H), 6.23 (dd, J=9.4, 8.2 Hz, 2H); $^{19}$F-NMR (600 MHz, DMSO-d$_6$): δ −61.12 (s, 24F); MS (ESI) [m/z]: [M-BArF$_{24}$]$^+$ calcd for C$_{36}$H$_{27}$IrN$_5$, 722.19; found, 722.19; [M-Ir(ppy)$_2$(pyim)]$^-$ calcd for C$_{32}$H$_{12}$BF$_{24}$, 863.06; found, 863.07.

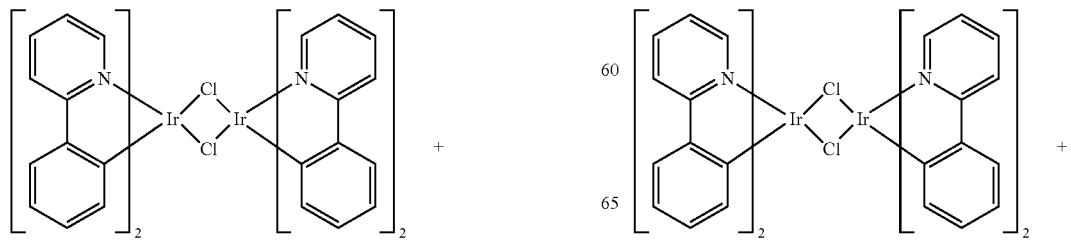

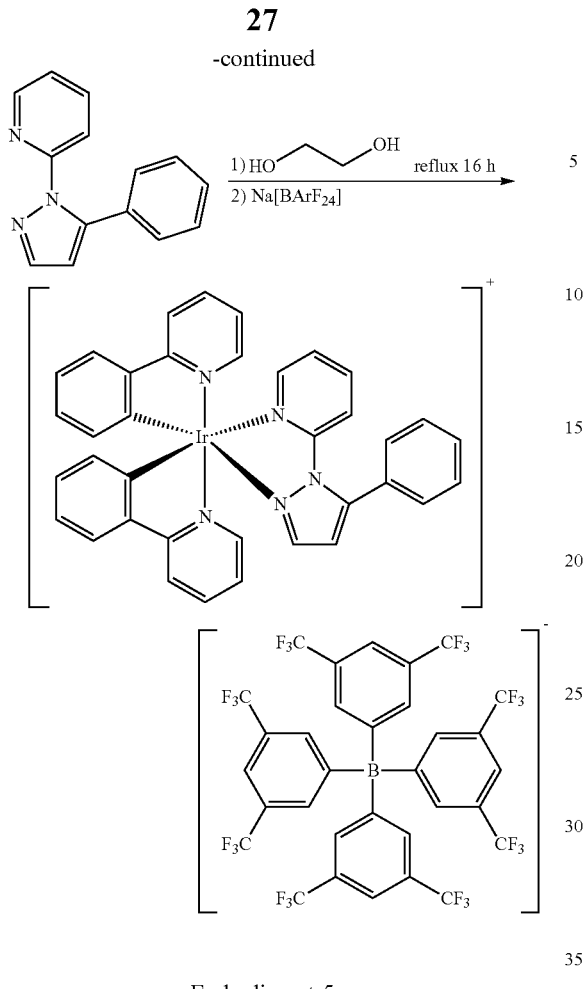

Embodiment 5

Synthesis Process of [Ir(ppy)$_2$(bpy)][BArF$_{24}$] Shown in Formula (14)

The reactants are [Ir(ppy)$_2$Cl]$_2$ (1.767 g, 1.65 mmol) and 2,2'-bipyridine (bpy) ligand (0.528 g, 3.38 mmol), and by going through the same synthesis method as that of Embodiment 2, the clathrate compound [Ir(ppy)$_2$(bpy)][BArF$_{24}$] shown in formula (14) is obtained as yellow powder (4.290 g, 2.82 mmol) at a yield of 86%.

$^1$H-NMR (600 MHz, DMSO-d$_6$): δ 8.89 (d, J=8.2 Hz, 2H), 8.27 (t, J=7.2 Hz, 4H), 7.95-7.90 (m, 4H), 7.88 (d, J=4.7 Hz, 2H), 7.71 (s, 4H), 7.69 (s, 2H), 7.63 (s, 2H), 7.62 (s, 8H), 7.16 (t, J=6.0 Hz, 2H), 7.03 (dd, J=12.6 Hz, 5.5 Hz, 2H), 6.90 (t, J=7.5 Hz, 2H), 6.20 (d, J=7.2 Hz, 2H); $^{19}$F-NMR (600 MHz, DMSO-d$_6$): δ −61.74 (s, 24F); MS (ESI) [m/z]: [M-BArF$_{24}$]$^+$ calcd for C$_{32}$H$_{24}$IrN$_4$, 657.16; found, 657.16; [M-Ir(ppy)$_2$(bpy)]$^-$ calcd for C$_{32}$H$_{12}$BF$_{24}$, 863.06; found, 863.06.

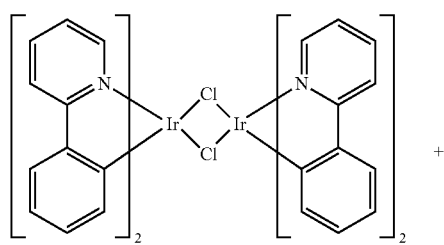

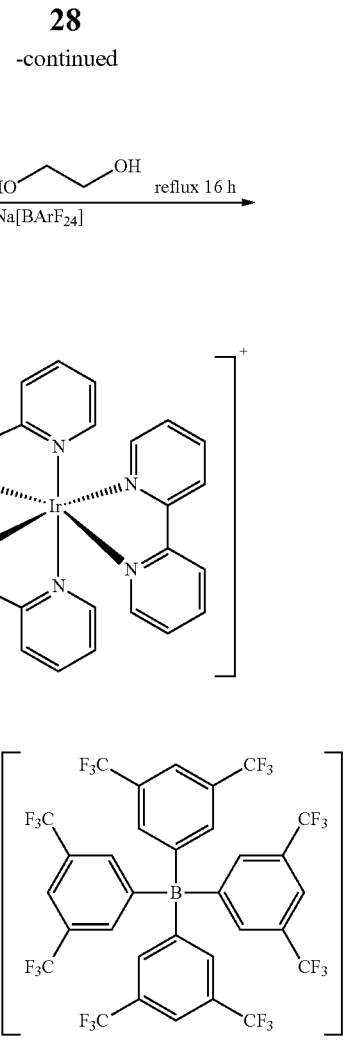

Embodiment 6

Synthesis Process of [Ir(ppy)$_2$(ptop)][BArF$_{24}$] Shown in Formula (15)

The reactants are [Ir(ppy)$_2$Cl]$_2$ (1.786 g, 1.67 mmol) and ptop ligand (0.798 g, 3.36 mmol), which are dissolved in methanol/CH$_2$Cl$_2$ (v/v=60:60 mL), and the rest of the synthesis method is the same as that of Embodiment 2, thereby obtaining the clathrate compound [Ir(ppy)$_2$(ptop)][BArF$_{24}$] shown in formula (15) as red powder (4.131 g, 2.58 mmol) at a yield of 77%.

$^1$H-NMR (600 MHz, DMSO-d$_6$): δ 8.66 (d, J=7.8 Hz, 1H), 8.37 (t, J=7.4 Hz, 1H), 8.26 (d, J=6.0 Hz, 1H), 8.22 (d, J=8.2 Hz, 2H), 8.01 (d, J=8.1 Hz, 2H), 7.93 (t, J=7.8 Hz, 2H), 7.88 (d, J=7.6 Hz, 1H), 7.82 (dd, J=5.9 Hz, 1H), 7.69 (s, 4H), 7.63 (d, J=5.9 Hz, 1H), 7.60 (s, 8H), 7.44 (d, J=8.0 Hz, 2H), 7.18 (t, J=6.6 Hz, 2H), 7.01 (dd, J=9.8 Hz, 4.9 Hz, 1H), 6.94 (t, J=7.4 Hz, 1H), 6.89 (t, J=7.3 Hz, 1H), 6.81 (t, J=7.1 Hz, 1H), 6.11 (dd, J=13.1 Hz, 7.6 Hz, 2H), 1.22 (s, 3H); $^{19}$F-NMR (600 MHz, DMSO-d$_6$): δ −61.51 (s, 24F); MS (ESI) [m/z]: [M-BArF$_{24}$]$^+$ calcd for C$_{36}$H$_{27}$IrN$_5$O, 738.18; found, 738.18; [M-Ir(ppy)$_2$(ptop)]$^-$ calcd for C$_{32}$H$_{12}$BF$_{24}$, 863.06; found, 863.06.

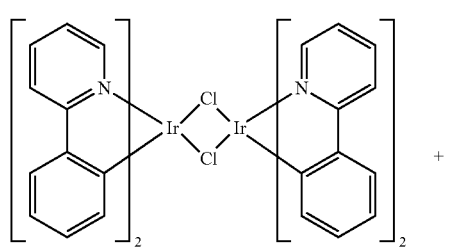

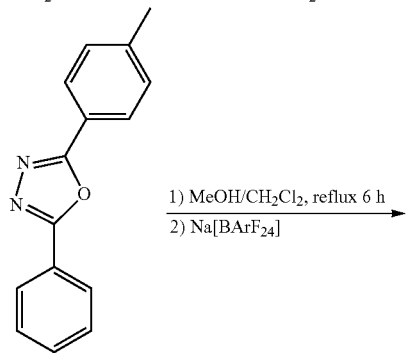

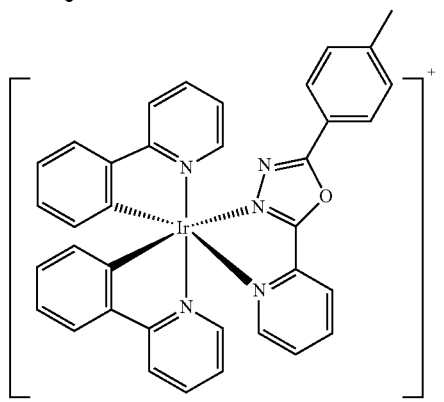

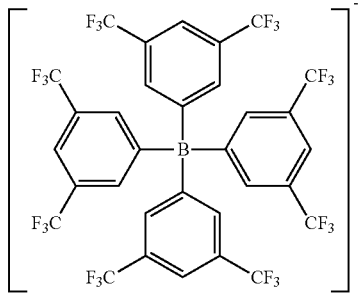

Embodiment 7

Synthesis Process of [Ir(ppy)$_2$(pop)][BArF$_{24}$] Shown in Formula (16)

The reactants are [Ir(ppy)$_2$Cl]$_2$ (1.775 g, 1.66 mmol) and pop ligand (0.740 g, 3.32 mmol), and by going through the same synthesis method as that of Embodiment 2, the clathrate compound [Ir(ppy)$_2$(pop)][BArF$_{24}$] shown in formula (16) is obtained as red powder (4.551 g, 2.87 mmol) at a yield of 87%.

$^1$H-NMR (600 MHz, DMSO-d$_6$): δ 8.68 (d, J=7.7 Hz, 1H), 8.38 (td, J=7.8 Hz, 2.1 Hz, 1H), 8.26 (d, J=5.5 Hz, 1H), 8.22 (d, J=8.5 Hz, 2H), 8.14-8.10 (m, 2H), 7.94 (t, J=7.8 Hz, 2H), 7.88 (d, J=8.7 Hz, 1H), 7.86-7.81 (m, 3H), 7.72 (d, J=7.4 Hz, 1H), 7.69 (s, 4H), 7.63 (dd, J=13.5 Hz, 6.1 Hz, 3H), 7.60 (s, 8H), 7.18 (dt, J=6.0 Hz, 4.7 Hz, 2H), 7.01 (t, J=7.6 Hz, 1H), 6.94 (t, J=7.6 Hz, 1H), 6.89 (dd, J=8.1 Hz, 7.1 Hz, 1H), 6.81 (t, J=7.5 Hz, 1H), 6.11 (dd, J=11.9 Hz, 7.5 Hz, 2H); $^{19}$F-NMR (600 MHz, DMSO-d$_6$): δ −61.60 (s, 24F); MS (ESI) [m/z]: [M-BArF$_{24}$]$^+$ calcd for C$_{35}$H$_{25}$IrN$_5$O, 724.17; found, 724.16; [M-Ir(ppy)$_2$(pop)]$^-$ calcd for C$_{32}$H$_{12}$BF$_{24}$, 863.06; found, 863.06.

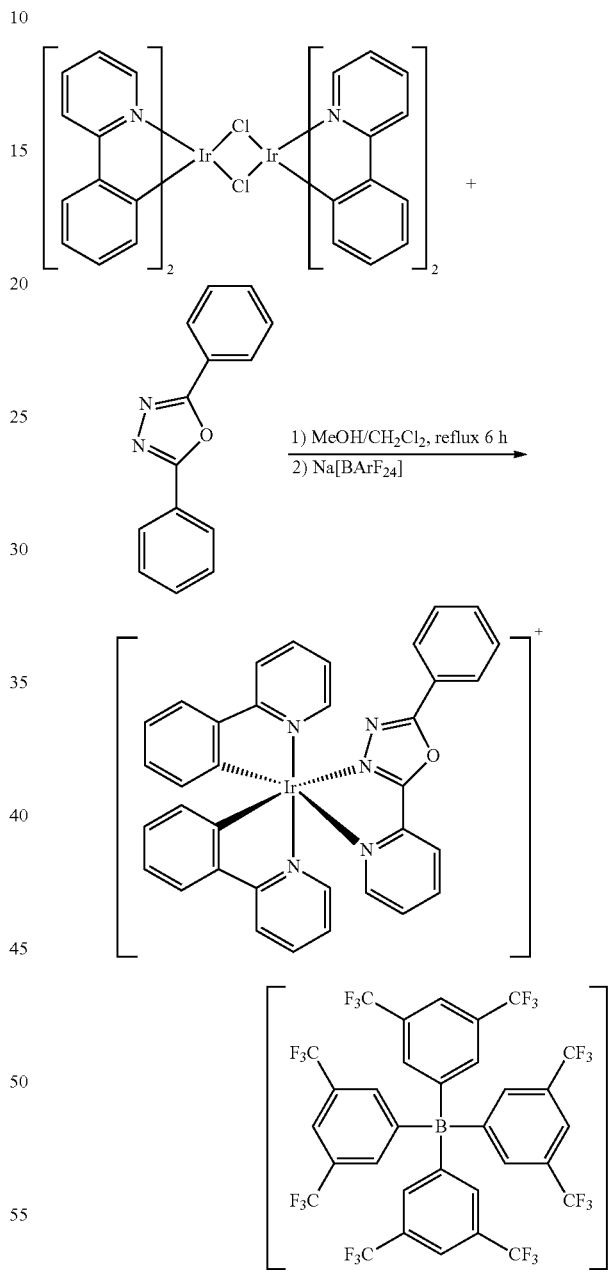

The clathrate compounds shown in formulas (11) to (16) prepared in Embodiments 2-7 undergo thermogravimetric analysis in N2 atmosphere, as shown in FIG. 1, it can be seen that the series of Iridium-containing depositable materials with [BArF$_{24}$]$^-$ as a counterion do not have notable mass loss until above 250° C., which indicates this type of materials have a high glass transition temperature and good thermal stability.

Embodiment 8

Synthesis Process of [Ir(dfppy)₂(pzpy)][B(5fph)₄] Shown in Formula (21)

The reactants are [Ir(ppy)₂Cl]₂ (0.473 g, 0.39 mmol) and dfpzpy ligand (0.187 g, 1.29 mmol), and by going through the same synthesis method as that of Embodiment 2, the clathrate compound [Ir(dfppy)₂(pzpy)][B(5fph)₄] shown in formula (21) is obtained as bright yellow powder (0.770 g, 0.56 mmol) at a yield of 71%.

¹H NMR (600 MHz, DMSO-d₆, δ) 9.34 (dd, J=2.9 Hz, 1.4 Hz, 1H), 8.55 (d, J=8.5 Hz, 1H), 8.39-8.36 (m, 1H), 8.30 (d, J=6.3 Hz, 2H), 8.09-8.04 (m, 2H), 7.84 (dd, J=6.8 Hz, 6.4 Hz, 1H), 7.78 (d, J=5.8 Hz, 1H), 7.75 (d, J=5.7 Hz, 1H), 7.57-7.53 (m, 2H), 7.34-7.23 (m, 3H), 7.19-7.13 (m, 1H), 7.00-6.91 (m, 3H). ¹⁹F NMR (600 MHz, DMSO-d₆, δ) −106.45 (s, 1F), −107.10 (s, 1F), −108.60 (s, 1F), −109.25 (s, 1F), −132.23 (s, 8F), −161.17 (s, 4F), −165.71 (s, 8F). MS (ESI) [m/z]: 718.40 [M-B(5fph)₄]⁺, 679.28 [M-Ir(dfppy)₂(pzpy)]⁻. Anal. Calcd. for C₅₄H₁₉BF₂₄IrN₅: C, 46.43; H, 1.37; N, 5.01. Found: C, 45.84; H, 1.50; N, 4.95.

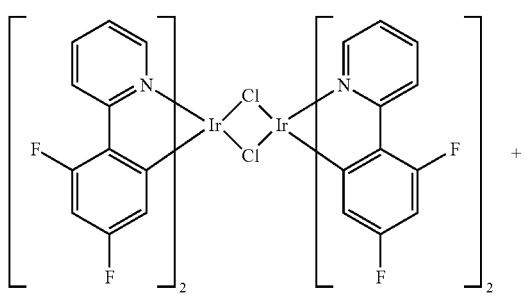

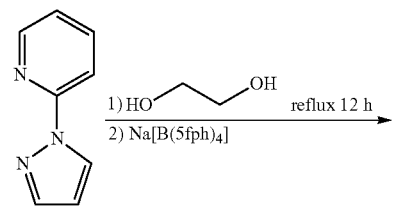

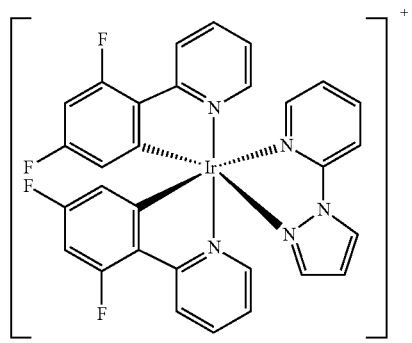

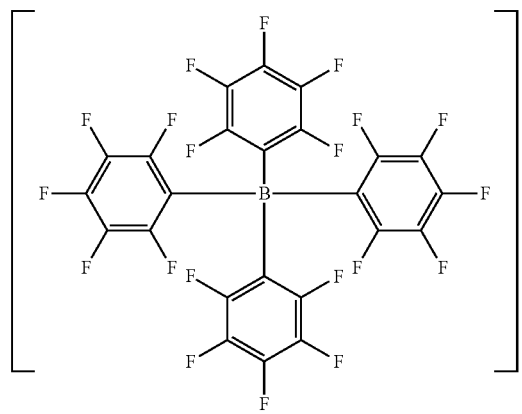

Embodiment 9

Synthesis Process of [Ir(ppy)₂(pzpy)][B(5fph)₄] Shown in Formula (22)

The reactants are [Ir(ppy)₂Cl]₂ (0.578 g, 0.54 mmol) and pzpy ligand (0.231 g, 1.59 mmol), and by going through the same synthesis method as that of Embodiment 2, the clathrate compound [Ir(ppy)₂(pzpy)][B(5fph)₄] shown in formula (22) is obtained as yellow powder (1.024 g, 0.77 mmol) at a yield of 72%.

¹H NMR (600 MHz, DMSO-d6, δ) 9.28 (d, J=2.8 Hz, 1H), 8.51 (d, J=8.3 Hz, 1H), 8.31 (t, J=8.0 Hz, 1H), 8.28-8.21 (m, 2H), 7.94 (d, J=7.8 Hz, 2H), 7.88 (dd, J=12.3, 7.8 Hz, 2H), 7.75 (d, J=5.7 Hz, 1H), 7.70 (d, J=5.6 Hz, 1H), 7.64 (d, J=5.5 Hz, 1H), 7.54-7.50 (m, 1H), 7.27 (s, 1H), 7.25-7.15 (m, 2H), 6.99 (dt, J=19.2, 7.5 Hz, 2H), 6.93-6.80 (m, 3H), 6.22-6.15 (m, 2H). ¹⁹F NMR (600 MHz, DMSO-d₆, δ) −132.35 (s, 8F), −161.20 (s, 4F), −165.81 (s, 8F). MS (ESI) [m/z]: 646.40 [M-B(5fph)₄]⁺, 679.22 [M-Ir(ppy)₂(pzpy)]⁻. Anal. Calcd. for C₅₄H₂₃BF₂₀IrN₅: C, 48.96; H, 1.75; N, 5.29. Found: C, 49.37; H, 2.00; N, 5.46.

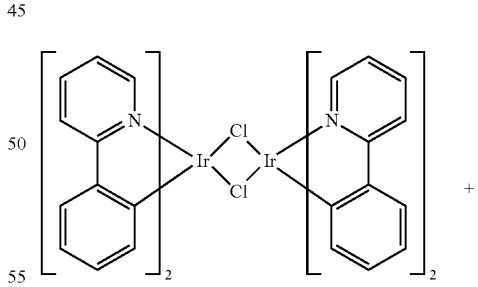

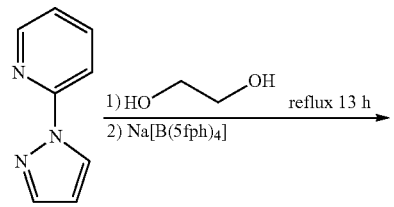

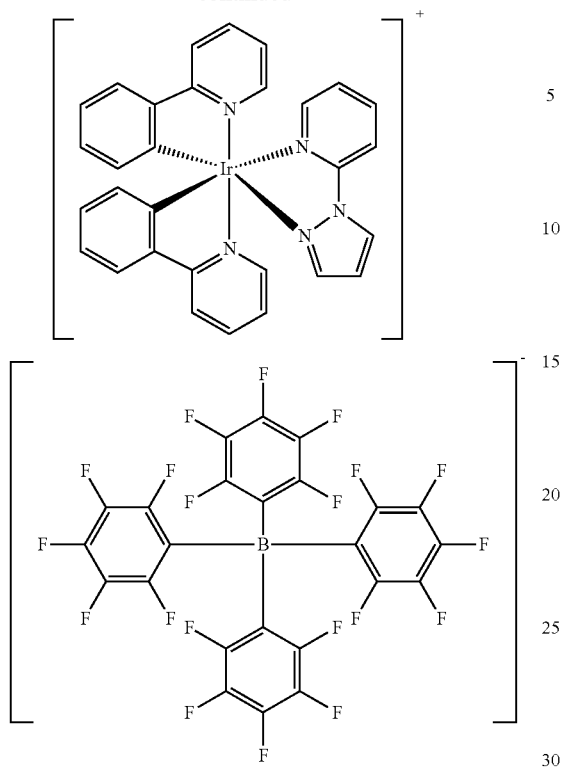

Embodiment 10

Synthesis Process of [Ir(ppy)₂(pyim)][B(5fph)₄] Shown in Formula (23)

The reactants are [Ir(ppy)₂Cl]₂ (0.569 g, 0.53 mmol) and pyim ligand (0.233 g, 1.05 mmol), and by going through the same synthesis method as that of Embodiment 2, the clathrate compound [Ir(ppy)₂(pyim)][B(5fph)₄] shown in formula (23) is obtained as yellow powder (1.024 g, 0.77 mmol) at a yield of 61%.

$^1$H NMR (600 MHz, DMSO-$d_6$, δ) 8.24 (t, J=8.9 Hz, 2H), 7.97-7.92 (m, 4H), 7.89 (dd, J=13.1, 6.8 Hz, 4H), 7.85 (d, J=1.1 Hz, 1H), 7.83 (d, J=5.3 Hz, 1H), 7.74 (d, J=5.7 Hz, 4H), 7.48 (dd, J=7.0, 6.2 Hz, 1H), 7.26 (dd, J=9.7, 3.5 Hz, 1H), 7.21 (t, J=6.6 Hz, 1H), 7.01-6.92 (m, 3H), 6.88 (dd, J=12.5, 5.0 Hz, 1H), 6.85 (t, J=7.4 Hz, 1H), 6.64 (d, J=1.3 Hz, 1H), 6.24 (dd, J=9.9, 7.8 Hz, 2H). $^{19}$F NMR (600 MHz, DMSO-$d_6$, δ) −132.36 (s, 8F), −161.18 (s, 4F), −166.20 (s, 8F). MS (ESI) [m/z]: 722.19 [M−B(5fph)₄]⁺, 678.98 [M−Ir(ppy)₂(pyim)]⁻. Anal. Calcd. for $C_{60}H_{27}BF_{20}IrN_5$: C, 51.44; H, 1.94; N, 5.00. Found: C, 51.79; H, 2.27; N, 4.87.

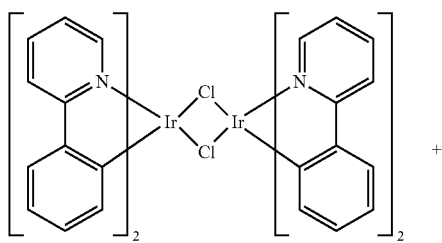

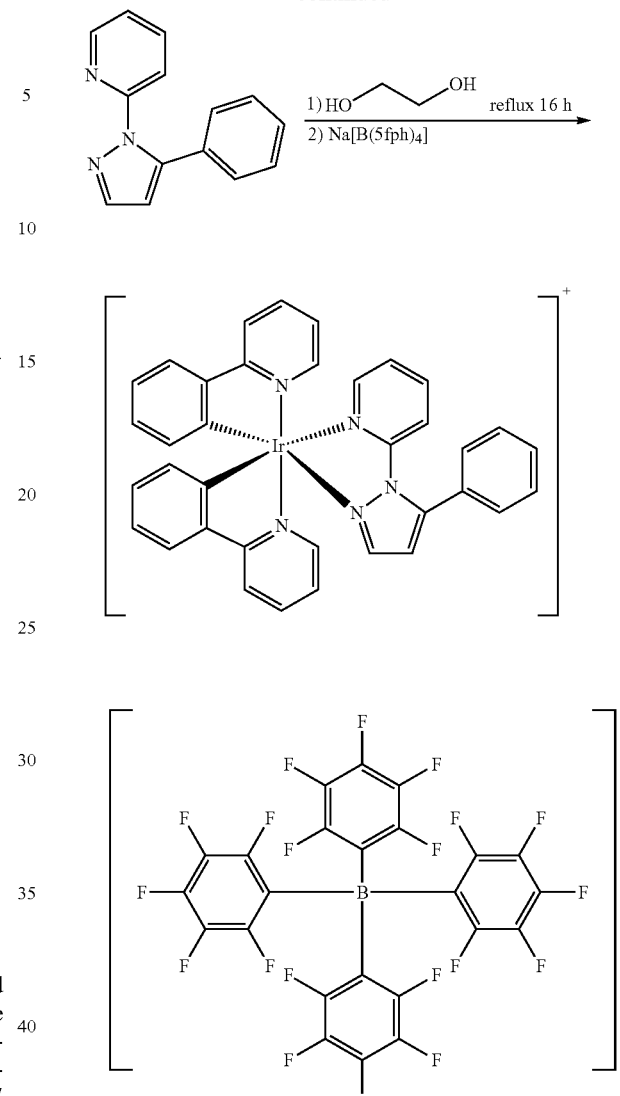

Embodiment 11

Synthesis Process of [Ir(ppy)₂(bpy)][B(5fph)₄] Shown in Formula (24)

The reactants are [Ir(ppy)₂Cl]₂ (0.655 g, 0.61 mmol) and 2,2'-bipyridine (bpy) ligand (0.25 g, 1.60 mmol), and by going through the same synthesis method as that of Embodiment 2, the clathrate compound [Ir(ppy)₂(bpy)][B(5fph)₄] shown in formula (24) is obtained as yellow powder (1.024 g, 0.77 mmol) at a yield of 65%.

$^1$H NMR (600 MHz, DMSO-$d_6$, δ) 8.89 (d, J=8.4 Hz, 2H), 8.28 (dd, J=11.0, 4.8 Hz, 4H), 7.96-7.91 (m, 4H), 7.89-7.87 (m, 2H), 7.70 (ddd, J=7.6, 5.5, 1.1 Hz, 2H), 7.62 (dd, J=5.8, 0.7 Hz, 2H), 7.18-7.15 (m, 2H), 7.05-7.00 (m, 2H), 6.91 (td, J=7.5, 1.3 Hz, 2H), 6.20 (dd, J=7.6, 0.6 Hz, 2H). MS (ESI) [m/z]: 657.16 [M−B(5fph)₄]⁺, 678.98 [M−Ir(ppy)₂(bpy)]⁻. Anal. Calcd. for $C_{56}H_{24}BF_{20}IrN_4$: C, 50.35; H, 1.81; N, 4.19. Found: C, 50.83; H, 2.24; N, 4.18.

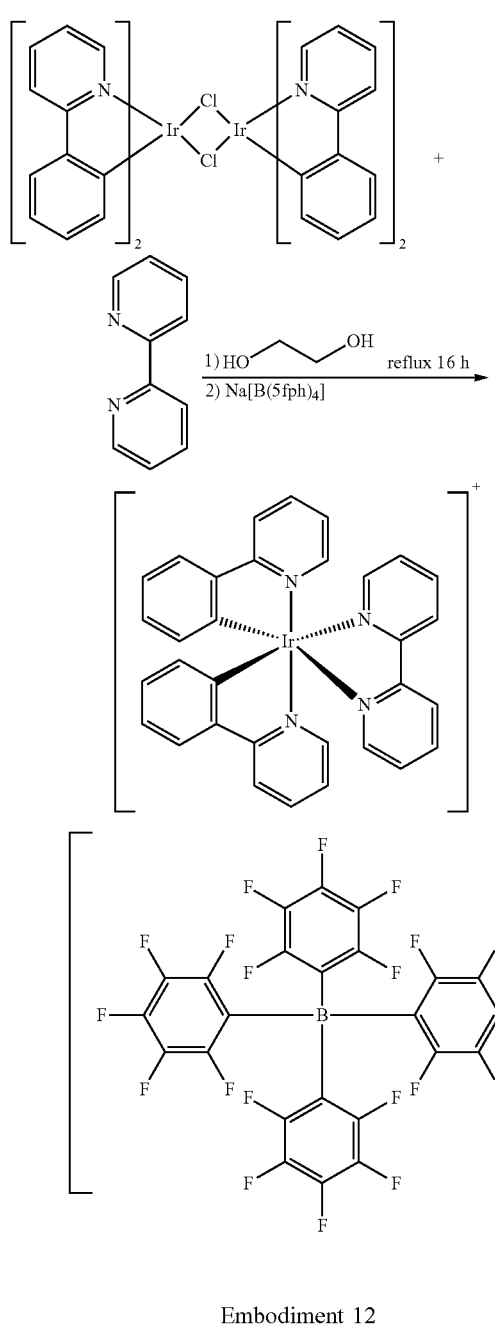

Embodiment 12

Synthesis Process of [Ir(ppy)₂(ptop)][B(5fph)₄] Shown in Formula (25)

The reactants are [Ir(ppy)₂Cl]₂ (1.775 g, 1.66 mmol) and ptop ligand (0.341 g, 1.44 mmol), and by going through the same synthesis method as that of Embodiment 2, the clathrate compound [Ir(ppy)₂(ptop)][B(5fph)₄] shown in formula (25) is obtained as red powder (1.65 g, 1.16 mmol) at a yield of 81%.

$^1$H NMR (600 MHz, DMSO-d$_6$, δ) 8.71 (d, J=7.8 Hz, 1H), 8.43 (td, J=7.8 Hz, 1.9 Hz, 1H), 8.32-8.30 (m, 1H), 8.29-8.26 (m, 2H), 8.07 (d, J=8.2 Hz, 2H), 8.01-7.97 (m, 2H), 7.93 (d, J=7.3 Hz, 1H), 7.87 (ddd, J=6.8 Hz, 5.5 Hz, 2.8 Hz, 3H), 7.69 (d, J=5.8 Hz, 3H), 7.49 (d, J=8.0 Hz, 1H), 7.25-7.21 (m, 2H), 7.08-7.04 (m, 1H), 7.01-6.97 (m, 1H), 6.94 (td, J=7.5 Hz, 1.2 Hz, 1H), 6.86 (td, J=7.5 Hz, 1.2 Hz, 1H), 6.16 (dd, J=12.9 Hz, 7.0 Hz, 1H), 2.53 (dt, J=3.6 Hz, 1.8 Hz, 3H). $^{19}$F NMR (600 MHz, DMSO-d$_6$, δ) −133.28 (s, 8F), −161.68 (s, 4F), −165.84 (s, 8F). MS (ESI) [m/z]: 738.18 [M-B(5fph)₄]⁺, 678.97 [M-Ir(ppy)₂(ptop)]⁻. Anal. Calcd. for C$_{60}$H$_{27}$BF$_{20}$IrN$_5$O: C, 50.86; H, 1.92; N, 4.94. Found: C, 51.93; H, 1.83; N, 4.98.

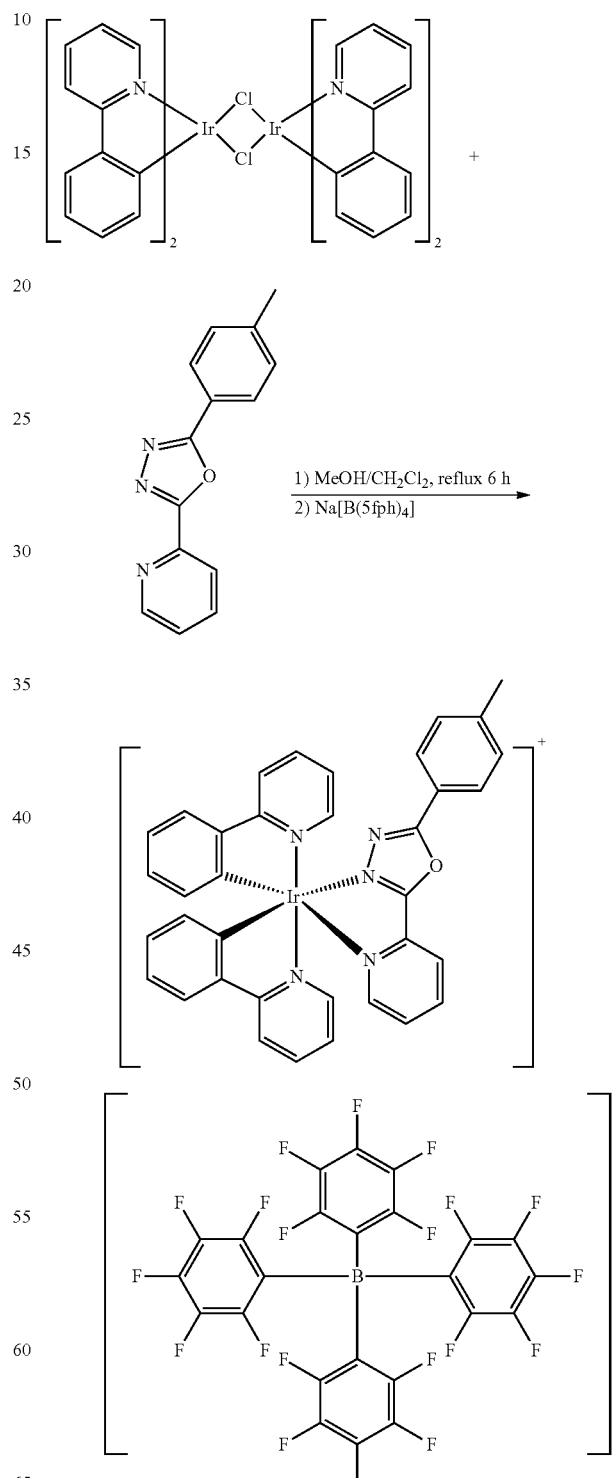

Embodiment 13

Synthesis Process of [Ir(ppy)₂(pop)][BArF₂₄] Shown in Formula (26)

The reactants are [Ir(ppy)₂Cl]₂ (0.576 g, 0.54 mmol) and pop ligand (0.243 g, 1.09 mmol), and by going through the same synthesis method as that of Embodiment 2, the clathrate compound [Ir(ppy)₂(pop)][BArF₂₄] shown in formula (26) is obtained as red powder (1.024 g, 0.77 mmol) at a yield of 74%.

$^1$H NMR (600 MHz, DMSO-$d_6$, δ) 8.73 (d, J=7.7 Hz, 1H), 8.43 (td, J=7.7 Hz, 1.6 Hz, 1H), 8.32 (d, J=5.2 Hz, 1H), 8.27 (d, J=8.0 Hz, 2H), 8.18 (d, J=7.3 Hz, 2H), 7.99 (t, J=7.8 Hz, 2H), 7.93 (d, J=7.6 Hz, 1H), 7.91-7.86 (m, 3H), 7.76 (t, J=7.5 Hz, 1H), 7.69 (dd, J=15.8 Hz, 7.5 Hz, 3H), 7.23 (ddd, J=6.0 Hz, 4.5 Hz, 2.2 Hz, 2H), 7.06 (dd, J=9.7 Hz, 5.3 Hz, 1H), 6.99 (t, J=7.5 Hz, 1H), 6.94 (t, J=7.5 Hz, 1H), 6.86 (t, J=7.4 Hz, 1H), 6.17 (dd, J=12.0 Hz, 7.6 Hz, 2H). $^{19}$F NMR (600 MHz, DMSO-$d_6$, δ) −133.30 (s, 8F), −161.68 (s, 4F), −166.65 (s, 8F). MS (ESI) [m/z]: 724.17 [M-B(5fph)₄]⁺, 678.97 [M-Ir(ppy)₂(pop)]⁻. Anal. Calcd. for C₅₉H₂₅BF₂₀IrN₅O: C, 50.51; H, 1.80; N, 4.99. Found: C, 51.88; H, 1.92; N, 4.98.

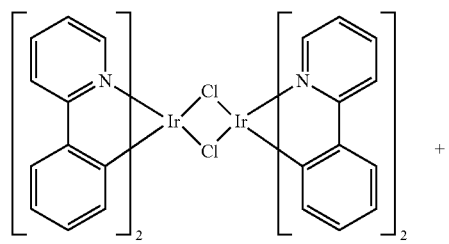

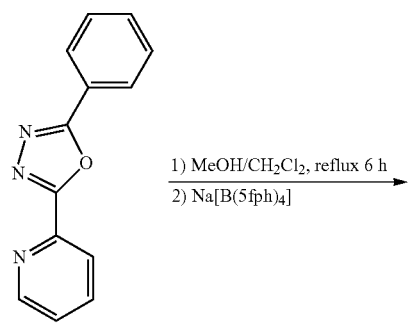

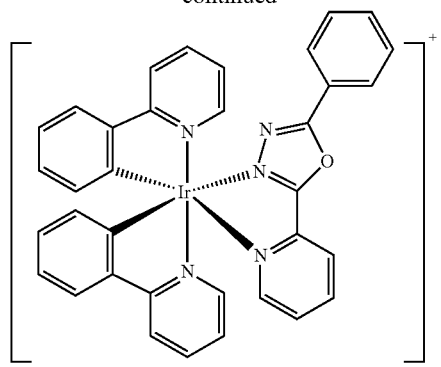

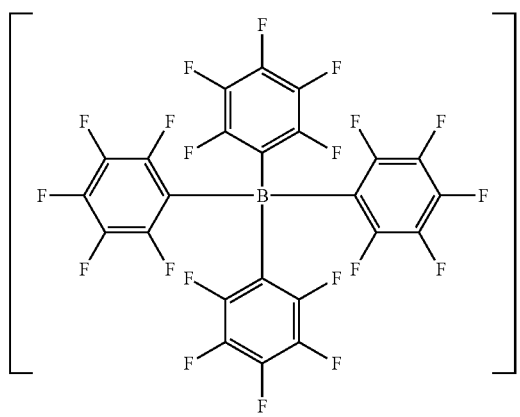

Figure 5:
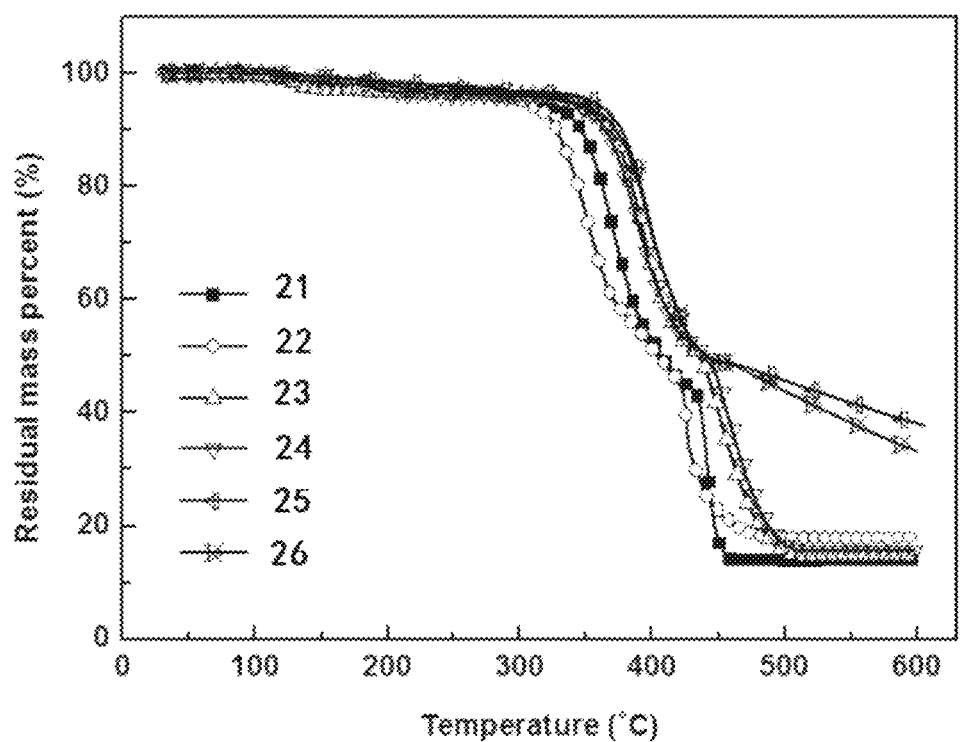
FIG. 5 is a thermogravimetric analysis diagram of the complexes shown by the formulas (21) to (26) in a N2 atmosphere.

The clathrate compounds shown in formulas (21) to (26) prepared in Embodiments 8-13 undergo thermogravimetric analysis in N2 atmosphere, as shown in FIG. 5, it can be seen that the series of Iridium-containing depositable materials with [B(5fph)₄]⁻ as a counterion do not have notable mass loss until above 320° C., which indicates this type of materials have a high glass transition temperature and good thermal stability.

Embodiment 14

Devices 1-6 of this embodiment have the following structure:

ITO/NPB (40 nm)/host material: x % dye (20 nm)/TPBi (30 nm)/Mg:Ag (150 nm)/Ag (50 nm)

The "x %" before the dye of the devices 1-6 represents a doping concentration of the dye in the organic light-emitting layer. In this embodiment and hereinafter, the doping concentration is measured in wt %.

TABLE 1

Performance of OLED devices made with clathrate compounds 11-16

| Structure of the organic light-emitting layer | PL wavelength $\lambda$ [nm][b] | Current efficiency $\eta_{max}$ [cd A$^{-1}$] | Luminance $B_{max}$ [cd m$^{-2}$] | EL wavelength $\lambda$ [nm][b] | CIE (x, y)[d] |
|---|---|---|---|---|---|
| CzPO$_2$: 2% clathrate compound 11 | 452, 481 | 1.3 | 6.0 × 10$^3$ | 446 | (0.16, 0.12) |
| 26DCzPPy: 8% clathrate compound 12 | 473, 502 | 3.0 | 11.9 × 10$^3$ | 476, 501 | (0.20, 0.37) |
| DIC-TRZ: 4% clathrate compound 13 | 527 | 16.3 | >27.1 × 10$^3$ | 532 | (0.36, 0.57) |
| DIC-TRZ: 2% clathrate compound 14 | 554 | 22.6 | >27.1 × 10$^3$ | 551 | (0.42, 0.54) |
| DIC-TRZ: 10% clathrate compound 15 | 597 | 7.1 | 16.3 × 10$^3$ | 588 | (0.51, 0.46) |
| DIC-TRZ: 6% clathrate compound 16 | 597 | 5.1 | 11.1 × 10$^3$ | 594 | (0.52, 0.46) |

In table 1:

The clathrate compound 11 refers to [Ir(dfppy)$_2$(pzpy)][BArF$_{24}$] shown in formula (11), and the corresponding device serial number is 1;

The clathrate compound 12 refers to [Ir(ppy)$_2$(pzpy)][BArF$_{24}$] shown in formula (12), and the corresponding device serial number is 2;

The clathrate compound 13 refers to [Ir(ppy)$_2$(pyim)][BArF$_{24}$] shown in formula (13), and the corresponding device serial number is 3;

The clathrate compound 14 refers to [Ir(ppy)$_2$(bpy)][BArF$_{24}$] shown in formula (14), and the corresponding device serial number is 4;

The clathrate compound 15 refers to [Ir(ppy)$_2$(ptop)][BArF$_{24}$] shown in formula (15), and the corresponding device serial number is 5;

The clathrate compound 16 refers to [Ir(ppy)$_2$(pop)][BArF$_{24}$] shown in formula (16), and the corresponding device serial number is 6.

Figure 2:
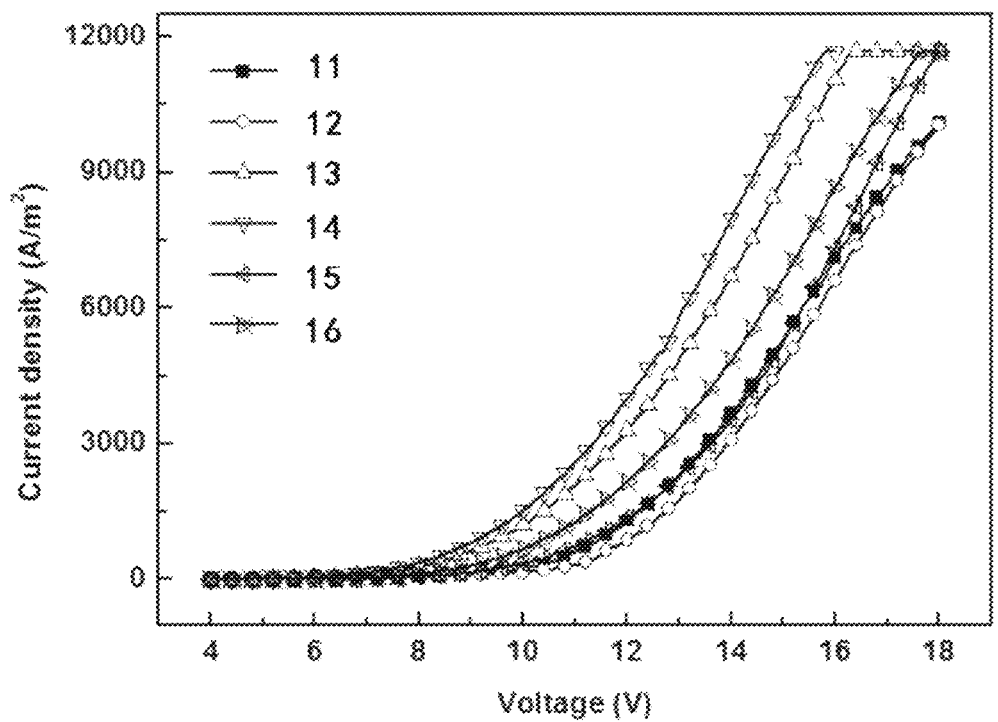
FIG. 2 is a current density-voltage spectrogram of the devices 1-6 in the application example 1.
Figure 3:
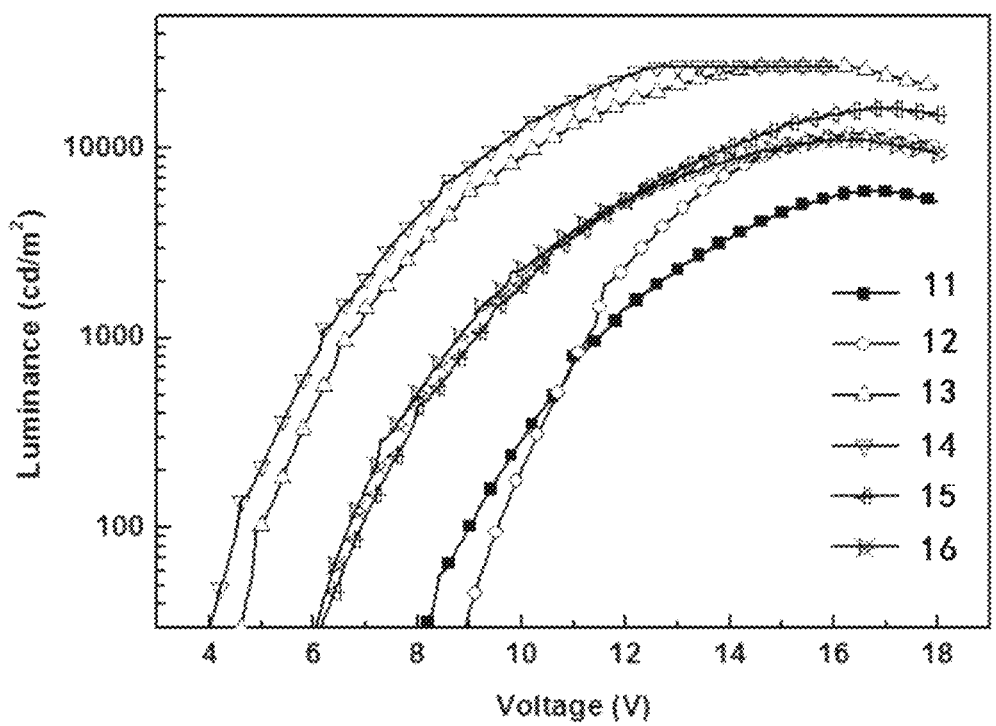
FIG. 3 is a luminance-voltage spectrogram of the devices 1-6 in the application example 1.
Figure 4:
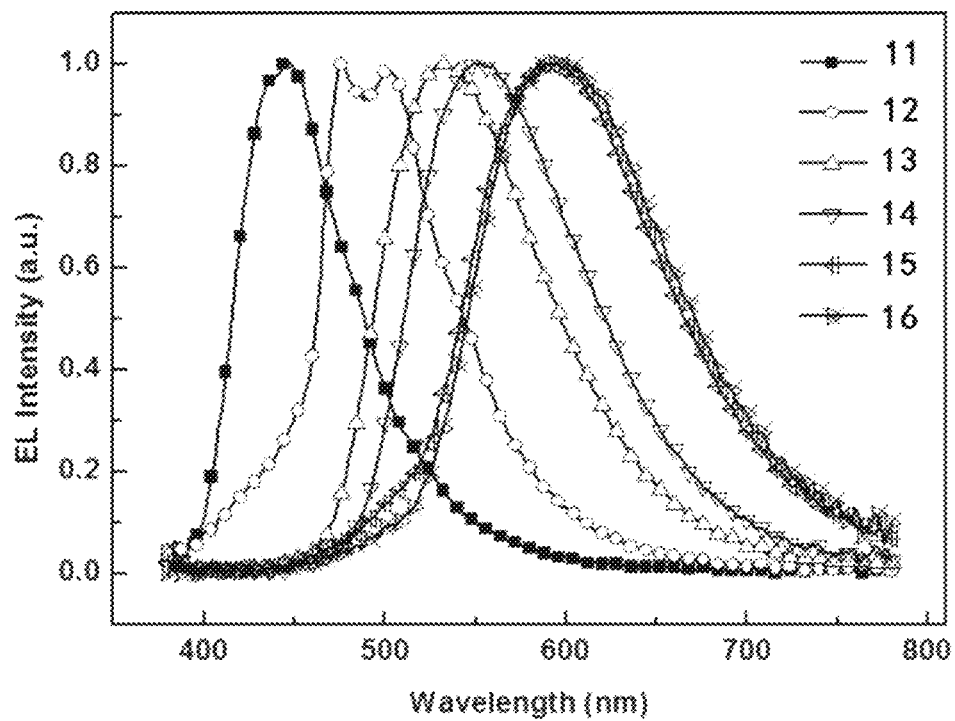
FIG. 4 is an EL spectrogram of the devices 1-6 in the application example 1.

The current density-voltage spectrogram of the devices 1-6 is shown in FIG. 2, their luminance-voltage spectrogram is shown in FIG. 3, their electroluminescence spectrogram is shown in FIG. 4. As seen from FIGS. 2-4, the devices begin to illuminate at a drive voltage of 4V, the maximum luminance is as high as 27.1×10$^3$ cd/m$^2$, and as seen from the electroluminescence spectrogram, they can realize light-emitting colors from blue to red. The "11, 12, 13, 14, 15, 16" in FIGS. 2-4 respectively represent the devices corresponding to the compounds shown in formula (11), formula (12), formula (13), formula (14), formula (15), formula (16).

Embodiment 15

Devices 7-12 of this embodiment have the following structure:

ITO/NPB (40 nm)/host material: x % dye (20 nm)/TPBi (30 nm)/Mg:Ag (150 nm)/Ag (50 nm)

The "x %" before the dye of the devices 7-12 represents a doping concentration of the dye in the organic light-emitting layer. In this embodiment and hereinafter, the doping concentration is measured in wt %.

TABLE 2

Performance of OLED devices made with clathrate compounds 21-26

| Structure of the organic light-emitting layer | PL wavelength $\lambda$ [nm][b] | Current efficiency $\eta_{max}$ [cd A$^{-1}$] | Luminance $B_{max}$ [cd m$^{-2}$] | EL wavelength $\lambda$ [nm][b] | CIE (x, y)[d] |
|---|---|---|---|---|---|
| CzPCh: 8% clathrate compound 21 | 452, 480 | 1.5 | 5.7 × 10$^3$ | 452 | (0.18, 0.19) |
| 26DCzPPy: 6% clathrate compound 22 | 476, 503 | 6.7 | 8.2 × 10$^3$ | 506 | (0.25, 0.47) |
| DIC-TRZ: 6% clathrate compound 23 | 531 | 15.3 | >27.1 × 10$^3$ | 532 | (0.35, 0.57) |
| DIC-TRZ: 8% clathrate compound 24 | 555 | 24.3 | >27.1 × 10$^3$ | 550 | (0.42, 0.54) |
| DIC-TRZ: 4% clathrate compound 25 | 599 | 4.5 | 22.1 × 10$^3$ | 588 | (0.51, 0.47) |
| DIC-TRZ: 6% clathrate compound 26 | 599 | 4.5 | 19.4 × 10$^3$ | 596 | (0.52, 0.46) |

In table 2:

The clathrate compound 21 refers to [Ir(dfppy)$_2$(pzpy)][B(5fph)$_4$] shown in formula (21), and the corresponding device serial number is 7;

The clathrate compound 22 refers to [Ir(ppy)$_2$(pzpy)][B(5fph)$_4$] shown in formula (22), and the corresponding device serial number is 8;

The clathrate compound 23 refers to [Ir(ppy)$_2$(pyim)][B(5fph)$_4$] shown in formula (23), and the corresponding device serial number is 9;

The clathrate compound 24 refers to [Ir(ppy)$_2$(bpy)][B(5fph)$_4$] shown in formula (24), and the corresponding device serial number is 10;

The clathrate compound 25 refers to [Ir(ppy)$_2$(ptop)][B(5fph)$_4$] shown in formula (25), and the corresponding device serial number is 11;

The clathrate compound 26 refers to [Ir(ppy)$_2$(pop)][BArF$_{24}$] shown in formula (26), and the corresponding device serial number is 12.

"CzPO$_2$: 2% clathrate compound 21" of the structure of the organic light-emitting layer in the first column of the Tables above refers to that the host material CzPO$_2$ of the organic light-emitting layer is doped with 2 wt % of dye, and the dye is [Ir(dfppy)$_2$(pzpy)][B(5fph)$_4$] shown in formula (21). And so on for the second to sixth lines.

Figure 6:
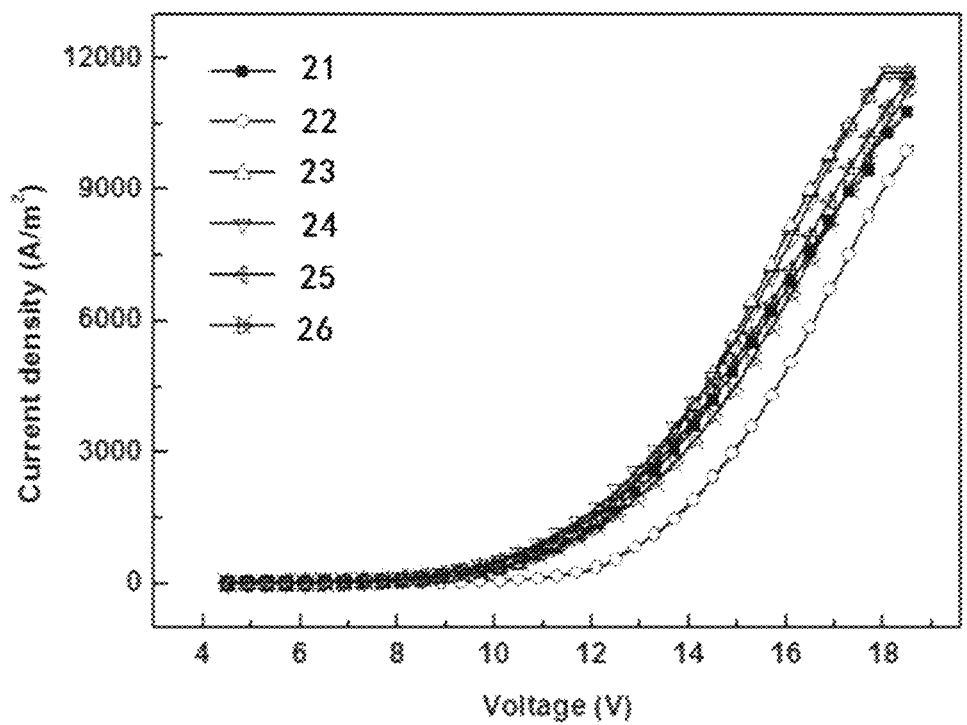
FIG. 6 is a current density-voltage spectrogram of the devices 7-12 in the application example 2.
Figure 7:
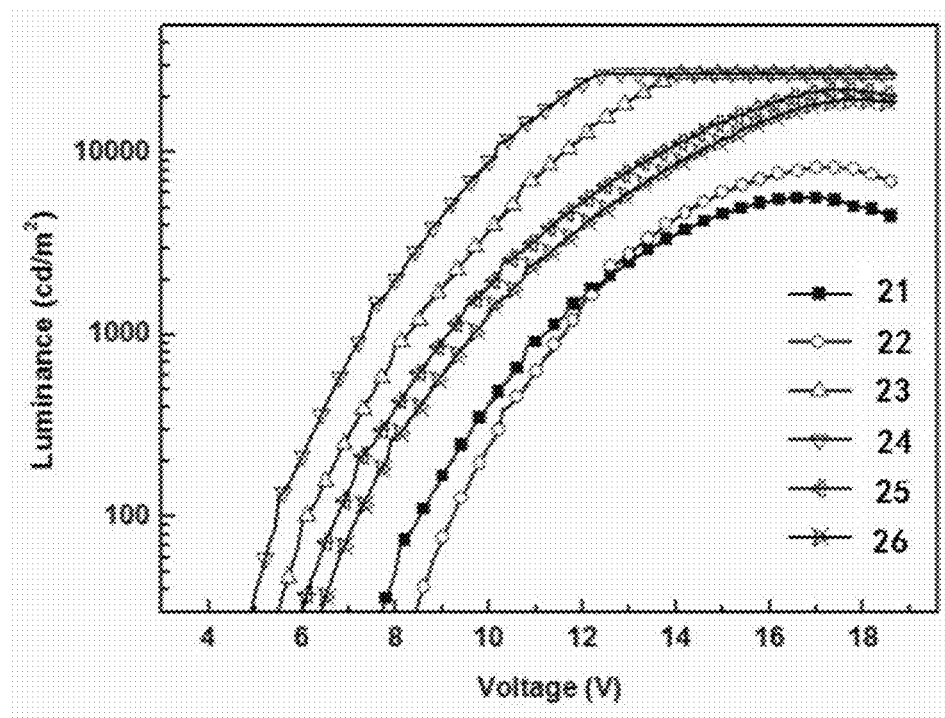
FIG. 7 is a luminance-voltage spectrogram of the devices 7-12 in the application example 2.
Figure 8:
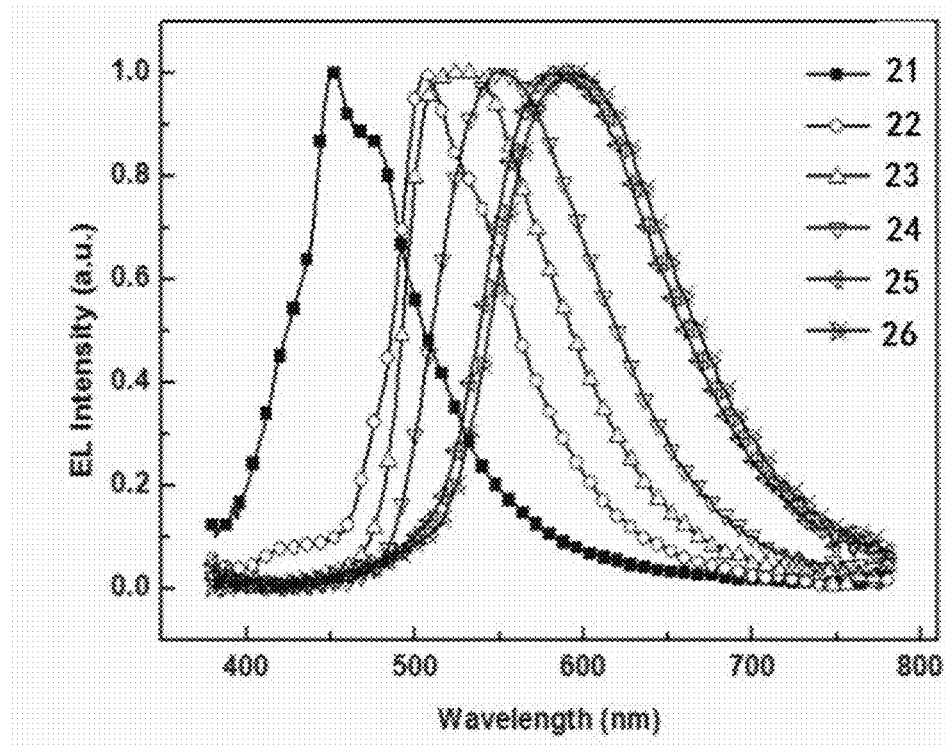
FIG. 8 is an EL spectrogram of the devices 7-12 in the application example 2.

The current density-voltage spectrogram of devices 7-12 is shown in FIG. 6, their luminance-voltage spectrogram is shown in FIG. 7, their electroluminescence spectrogram is shown in FIG. 8. As seen from FIGS. 6-8, the devices begin to illuminate at a drive voltage of 4V, the maximum luminance is as high as 27.1×10$^3$ cd/m$^2$, and as seen from the electroluminescence spectrogram, they can realize light-emitting colors from blue to red. The "21, 22, 23, 24, 25, 26" in FIGS. 6-8 respectively represent the devices corresponding to the compounds shown in formula (21), formula (22), formula (23), formula (24), formula (25), formula (26).

Embodiment 16

A device 13 of this embodiment has the following structure:
ITO/NPB (40 nm)/host material: 4% dye (50 nm)/TPBi (30 nm)/Mg:Ag (150 nm)/Ag (50 nm)
The host material and dye of the device 13 is the same as the device 1.

Embodiment 17

A device 14 of this embodiment has the following structure:
ITO/NPB (40 nm)/host material: 6% dye (30 nm)/TPBi (30 nm)/Mg:Ag (150 nm)/Ag (50 nm)
The host material and dye of the device 14 is the same as the device 1.

Embodiment 18

A device 15 of this embodiment has the following structure:
ITO/NPB (40 nm)/host material: 7% dye (10 nm)/TPBi (30 nm)/Mg:Ag (150 nm)/Ag (50 nm)
The host material and dye of the device 15 is the same as the device 1.

The molecular formulas of the materials involved in the present invention are as follows:

| Abbreviation | Full name | Structural formula |
|---|---|---|
| NPB | N,N'-di-(1-naphthyl)-N,N'-diphenyl-1,1'-biphenyl-4,4'-diamine | 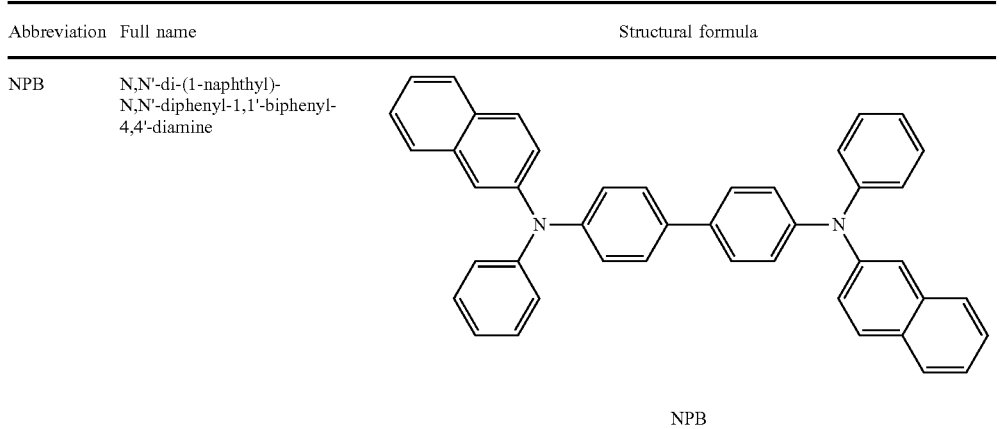 NPB |
| TPBi | 1,3,5-tri-(1-phenyl-1H-benzimidazole-2-yl)-benzene | 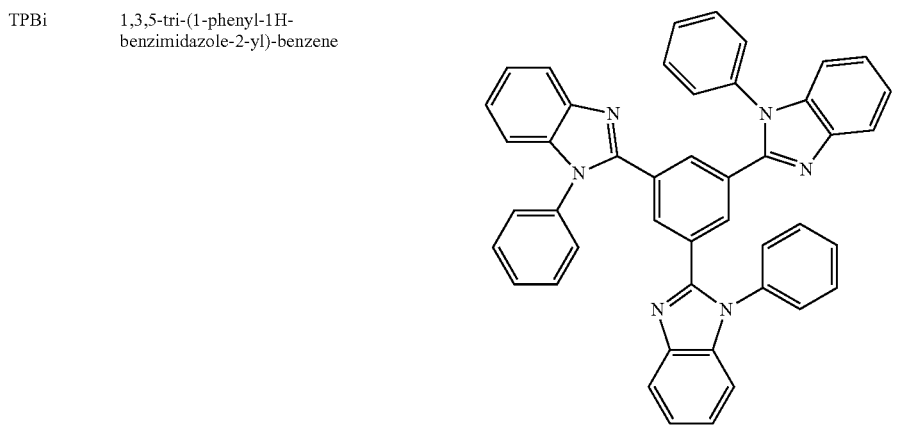 |

| Abbreviation | Full name | Structural formula |
|---|---|---|
| CzPO₂ | 9-(3,5-di-(diphenyl-phosphoryl)-phenyl)-9H-carbazole | |
| 26DCzPPy | 2,6-di-(3-(9H-carbazole-9-yl)-phenyl)-pyridine | |
| DIC-PIZ | 2-[9-phenyl]-indolo[2,3-A]carbazole-4,6-diphenyl-1,3,5-triazine | |

Although the present invention is described with reference to specific embodiments, the present invention is not limited to the aforementioned embodiments. It should be understood that, under the guidance of the inventive concept of the present invention, a person skilled in the art can conduct various changes and modifications, and the scope of the present invention is summarized by the appended Claims.

What is claimed is:

1. A depositable ionic organic functional material, wherein the depositable ionic organic functional material has a structure selected from the following formulas (21) to (26):

formula (21)

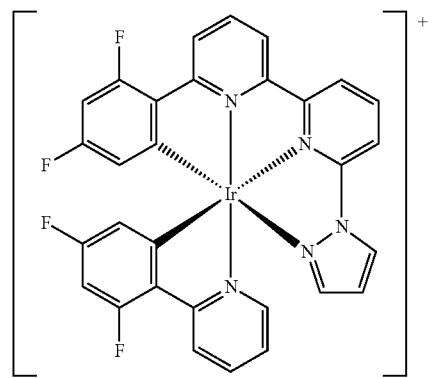

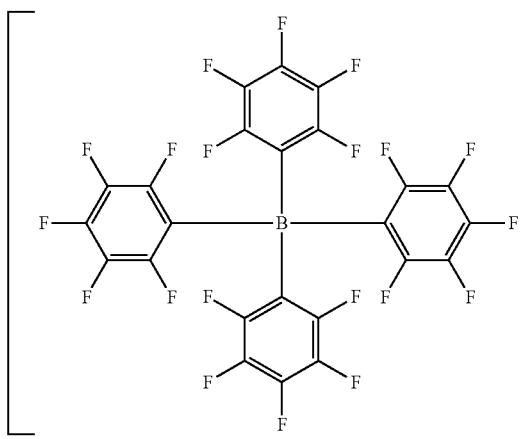

formula (22)

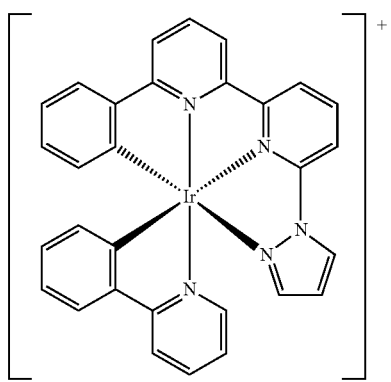

-continued

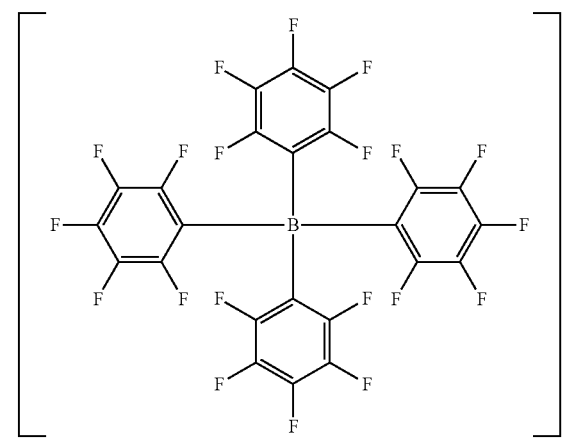

formula (23)

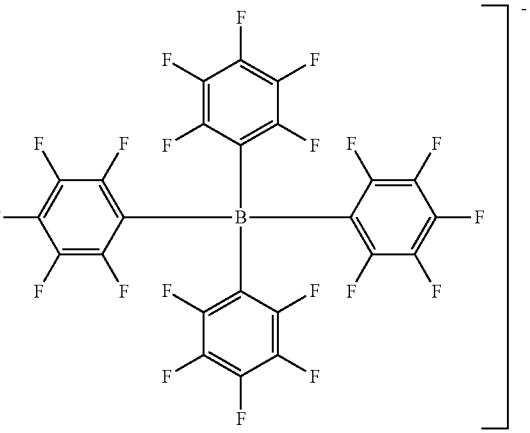

formula (24)

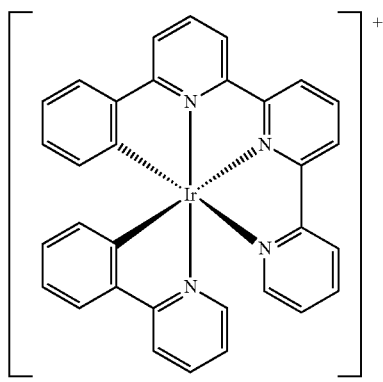

-continued

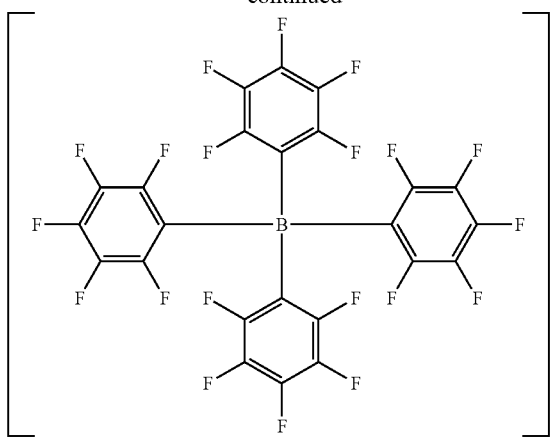

formula (25)

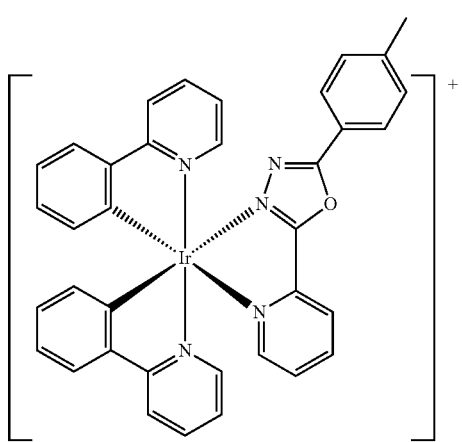

-continued formula (26)

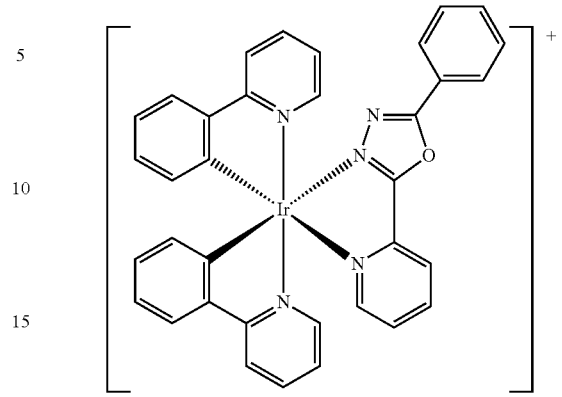

2. A method of using the depositable ionic organic functional material according to claim 1 in an organic electroluminescent device comprising: doping the depositable ionic organic functional material as a dye in an organic light-emitting layer of the organic electroluminescent device.

3. An organic electroluminescent device, comprising a substrate, and an anode layer, an organic light-emitting functional layer, a cathode layer formed in sequence upon the substrate, wherein the organic light-emitting functional layer comprises a hole transport layer, an organic light-emitting layer, and an electron transport layer, wherein a host material of the organic light-emitting layer is doped with the depositable ionic organic functional material according to claim 1.

4. The organic electroluminescent device according to claim 3, wherein a doping concentration of the depositable ionic organic functional material is 2 wt % 10 wt % of the total weight of the organic light-emitting layer.

5. The organic electroluminescent device according to claim 3, wherein the depositable ionic organic functional material is a red, yellow, green, or blue light emitting material.

6. The organic electroluminescent device according to claim 3, wherein the organic light-emitting layer has a thickness of 10 nm 50 nm.

7. The organic electroluminescent device according to claim 6, wherein the organic light-emitting layer has a thickness of 10 nm-30 nm.

* * * * *